(12) United States Patent
Murakuki et al.

(10) Patent No.: US 7,136,313 B2
(45) Date of Patent: Nov. 14, 2006

(54) SEMICONDUCTOR STORAGE DEVICE

(75) Inventors: Yasuo Murakuki, Kyoto (JP); Hiroshige Hirano, Nara (JP); Yasushi Gohou, Osaka (JP); Masahiko Sakagami, Kyoto (JP); Kunisato Yamaoka, Osaka (JP); Shunichi Iwanari, Kyoto (JP); Tetsuji Nakakuma, Shiga (JP); Takashi Miki, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 50 days.

(21) Appl. No.: 11/121,939

(22) Filed: May 5, 2005

(65) Prior Publication Data
US 2005/0265090 A1 Dec. 1, 2005

(30) Foreign Application Priority Data
May 12, 2004 (JP) .................. P. 2004-142418

(51) Int. Cl.
G11C 7/00 (2006.01)
G11C 8/00 (2006.01)
(52) U.S. Cl. .................. 365/200; 365/189.12; 365/211
(58) Field of Classification Search ................ 365/200, 365/189.12, 189.07, 211
See application file for complete search history.

(56) References Cited

U.S. PATENT DOCUMENTS 6,438,029 B1 * 8/2002 Hiraki et al. .......... 365/185.09
6,462,995 B1 10/2002 Urakawa
6,563,732 B1 5/2003 Matarrese et al.
6,611,458 B1 8/2003 Ishibashi et al.
6,781,893 B1 * 8/2004 Hiraki et al. ................ 365/194
7,054,207 B1 * 5/2006 Keeth et al. ................ 365/200
2003/0014688 A1 1/2003 Wu

FOREIGN PATENT DOCUMENTS

JP 2002-117692 4/2002

* cited by examiner

Primary Examiner—Son T. Dinh
(74) Attorney, Agent, or Firm—McDermott Will & Emery LLP

(57) ABSTRACT

To provide a semiconductor storage device which can adapt to assembly processes involving different treatment temperatures, can become unrewritable when rewriting of data by the user is prohibited, negates the necessity for developing different semiconductor storage devices, and lowers development cost.

A semiconductor storage device is provided with, as areas for storing faulty address information indicating a faulty area and operation mode setting information about the semiconductor storage device, a first setting function storage area 103 formed from electrically-rewritable nonvolatile memory and a second setting function storage area 102 formed from once-rewritable nonvolatile memory. Transfer of faulty address information to a faulty address register 111 and transfer of operation mode setting information to an operation mode register 110 are selectively performed.

10 Claims, 18 Drawing Sheets

SEMICONDUCTOR STORAGE DEVICE

BACKGROUND OF THE INVENTION

1. Filed of the Invention

The present invention relates to a semiconductor storage device including nonvolatile memory, and more particularly, to a semiconductor storage device including nonvolatile memory for storing address information about a faulty area, memory operation setting information, and operation setting information about a semiconductor storage device, or the like.

2. Description of the Related Art

Recently, nonvolatile memory having the function of latching data even at power-off includes flash memory, electrically-rewritable nonvolatile semiconductor memory (EEPROM or the like), and ferroelectric memory (FeRAM).

Such nonvolatile memory can be optimized by storing operation modes of the semiconductor storage device in which the memory is contained. When a deficiency is found in a memory cell, the address of the faulty area is stored, and the information is utilized, thereby replacing the memory cell in the faulty area.

Optimization of the operation mode, replacement of the memory cell in the faulty area, and initialization of memory data or the operation mode are performed by means of storing operation modes and addresses of faulty areas in the nonvolatile memory beforehand, and reading the information from a specific address area after power-on to thus perform desired setting (see JP-A-2002-117692 (pg. 14 and FIG. 1)).

In relation to a related-art semiconductor storage device, when the temperature of heat treatment performed during an assembly processes falls outside a guaranteed temperature at which a memory cell can latch data, replacement of a memory cell in a faulty area becomes impossible. Therefore, for instance, a redundant memory cell is replaced with a physical fuse.

However, in the case of a semiconductor storage device manufactured during a low-temperature assembly process (within the guaranteed temperature at which a memory cell can latch data), it is desirable to store the address of a faulty area in electrically-rewritable nonvolatile memory (EEPROM or the like) and to replace a memory cell in the faulty area even after assembly, to thus make an attempt to greatly enhance yield.

Moreover, there may be a case where storing operation modes or a faulty address in memory (mask ROM or the like) which cannot be rewritten by the user is desired. Such mask ROM or the like is not affected by the temperature of heat treatment during the assembly process, but the data acquired after assembly are unrewritable.

The related-art semiconductor storage device cannot satisfy the foregoing competing requirements simultaneously. Different semiconductor devices must be developed in response to the respective desires, raising a problem of an increase in development cost.

SUMMARY OF THE INVENTION

The present invention has been conceived in light of the foregoing problem and aims at providing a semiconductor storage device which can adapt to assembly processes involving different treatment temperatures, can become unrewritable when rewriting of data by the user is prohibited, negates the necessity for developing different semiconductor storage devices, and lowers development cost.

To solve the problem, a semiconductor storage device according to claim 1 of the present invention is directed toward a semiconductor storage device having a memory cell array section into which nonvolatile memory is arranged, and a peripheral circuit section for performing input/output of data into/from the memory cell array section and memory control, wherein the memory cell array section has
- a main storage area;
- a redundant storage area for storing information in lieu of a faulty area of the main storage area;
- a first setting function storage area and a second setting function storage area for storing faulty address information indicating the faulty area and operation mode setting information about the semiconductor storage device; the first setting function storage area is formed from electrically-rewritable nonvolatile memory; the second setting function storage area is formed from once-rewritable nonvolatile memory; the peripheral circuit section comprises
- an operation mode register for temporarily storing the operation mode setting information;
- a faulty address register for temporarily storing the faulty address information; and
- the semiconductor storage device further has
- selective transfer means for selectively transferring, from the first setting function storage area and the second setting function storage area, the operation mode setting information to the operation mode register or the faulty address information to the faulty address register.

A semiconductor storage device according to claim 2 of the present invention is characterized in that the selective transfer means is configured so as to be able to select, in accordance with a combination of transfer selection signals input from the outside, transfer of the operation mode setting information and/or the faulty address information from the first setting function storage area or transfer of the operation mode setting information and/or the faulty address information from the second setting function storage area.

A semiconductor storage device according to claim 3 of the present invention is characterized in that the selective transfer means is configured so as to be able to select, in accordance with transfer specification information stored in a transfer specification information storage area, transfer of the operation mode setting information and/or the faulty address information from the first setting function storage area or transfer of the operation mode setting information and/or the faulty address information from the second setting function storage area.

A semiconductor storage device according to claim 4 of the present invention is characterized in that the semiconductor storage device according to claim 3, wherein the transfer specification information storage area is formed from once-rewritable nonvolatile memory.

A semiconductor storage device according to claim 5 of the present invention is characterized in that the transfer specification information storage area is formed from electrically-rewritable nonvolatile memory.

A semiconductor storage device according to claim 6 of the present invention is characterized in that the transfer specification information is formed from a plurality of bits; the semiconductor storage device further comprises
- a matching determination circuit for determining occurrence of a match among the plurality of bits; and
- the matching determination circuit is configured so as to be able to count mismatched bits or matched bits determined as a result of matching determination; and the selective transfer means is controlled on the basis of a count result of the mismatched bits.

A semiconductor storage device according to claim 7 of the present invention is characterized by further comprising a source voltage detection circuit; and wherein the selective transfer means is controlled by source voltage information output from the source voltage detection circuit.

A semiconductor storage device according to claim 8 of the present invention is characterized by further comprising a temperature detection circuit; and wherein the selective transfer means is controlled by temperature information output from the temperature detection circuit.

A semiconductor storage device according to claim 9 of the present invention is characterized by further comprising a terminal into which a transfer stop signal is to be input and another terminal into which a transfer start signal is to be input, wherein, when the transfer start signal is brought to "H" after power-on by bringing the transfer stop signal and the transfer start signal to "L," transfer stop signal determination means determines the transfer stop signal as "L," and transfer start signal determination means determines the transfer start signal "H," thereby commencing transfer of the operation mode setting information and/or the faulty address information.

A semiconductor storage device according to claim 10 of the present invention is characterized in that the first setting function storage area is formed from ferroelectric memory; the second setting function storage area is formed from physical fuse memory; and an operation mode register and a faulty address register are formed from SRAM.

By means of application of the present invention, in relation to a semiconductor storage device to be manufactured through assembly processes involving high-temperature heat treatment such as CSP, when during the course of heat treatment the temperature exceeds a guaranteed temperature of electrically-rewritable nonvolatile memory (ferroelectric memory or the like), faulty address information is stored in once-rewritable nonvolatile memory (a physical fuse or the like). Mode setting data are stored in electrically-rewritable nonvolatile memory. There can be performed setting of transfer of data from the once-rewritable nonvolatile memory to a faulty address register and transfer of an operation mode from the nonvolatile memory.

If the heat treatment in the assembly processes falls within the temperature range at which data in the nonvolatile memory are guaranteed, the ability to replace a memory cell in a faulty area after assembly is desirable for further enhancing a yield. For this reason, the faulty address information and the mode setting data are stored in the nonvolatile memory, and setting can be made such that the faulty address information and the operation mode setting information are transferred from the electrically-rewritable nonvolatile memory.

When rewriting of data by the user is not desired, setting can be made such that the faulty address information and the operation mode setting data are stored in electrically-rewritable nonvolatile memory and such that the faulty address information and the operation mode are transferred from the once-rewritable nonvolatile memory.

Specifically, according to the present invention, the semiconductor storage devices of (1) to (4) can be embodied by means of a single semiconductor storage device, whereby a period and cost of development can be curtailed.

(1) A high-security semiconductor storage device-which enables replacement of a memory cell in a faulty area with high reliability and which prevents the user from rewriting operation mode data and faulty address data—can be embodied by means of storing the faulty address data and the operation mode data in once-rewritable nonvolatile memory.

(2) A semiconductor storage device—which has a high degree of freedom in replacement of a memory cell in a faulty area after assembly and enables flexible setting of an operation mode—can be embodied by means of storing the faulty address data in the once-rewritable nonvolatile memory and storing operation mode data in electrically-rewritable nonvolatile memory.

(3) A semiconductor storage device—which has a high degree of freedom in replacement of a memory cell in a faulty area after assembly and has a high degree of freedom in flexible operation mode setting—can be embodied by means of storing the faulty address data and the operation mode data into the electrically-rewritable nonvolatile memory.

(4) A high-security semiconductor storage device—which has a high degree of freedom in replacement of a memory cell in a faulty area after assembly and which prevents the user from rewriting operation mode data—can be embodied by means of storing the faulty address data in the electrically-rewritable nonvolatile memory and the operation mode data into the once-rewritable memory cell.

DESCRIPTION OF THE PREFERRED EMBODIMENTS

Embodiments of the present invention will be described hereunder by reference to the drawings.

(First Embodiment)

Figure 1:
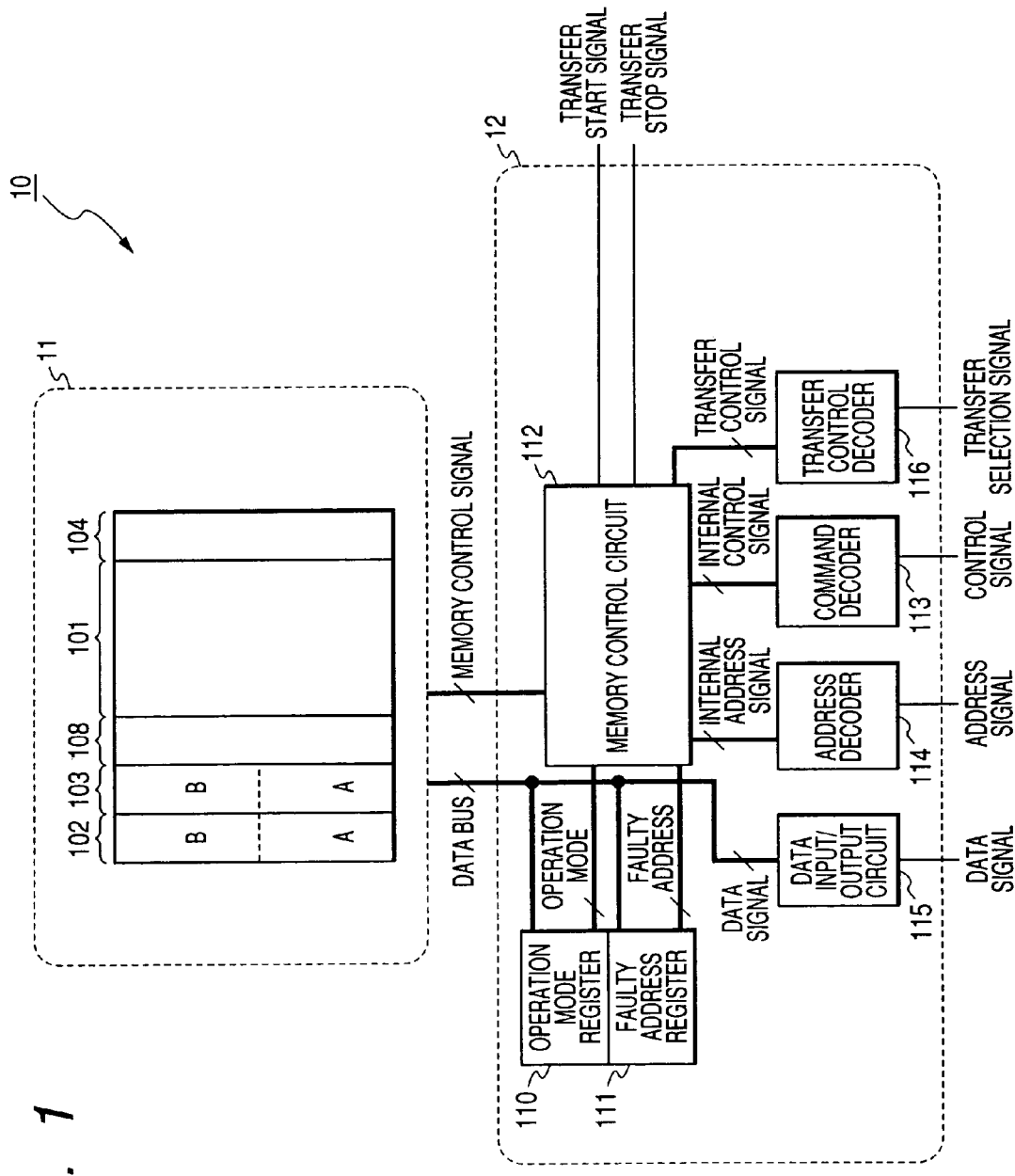
FIG. 1 is a block diagram showing the configuration of a semiconductor storage device according to a first embodiment of the present invention.

FIG. 1 is a block diagram showing the configuration of a semiconductor storage device 10 according to a first embodiment of the present invention; that is, a configuration using a physical fuse and ferroelectric memory (FeRAM) as nonvolatile memory.

As shown in FIG. 1, the semiconductor storage device 10 is made up of a memory cell array section 11 formed from nonvolatile memory, and a peripheral circuit section 12 for enabling input/output of data into/from the memory cell array section 11 and memory control.

The memory cell array section 11 is made up of a physical fuse and ferroelectric memory, and individual sections of the configuration will be described below.

Figure 2:
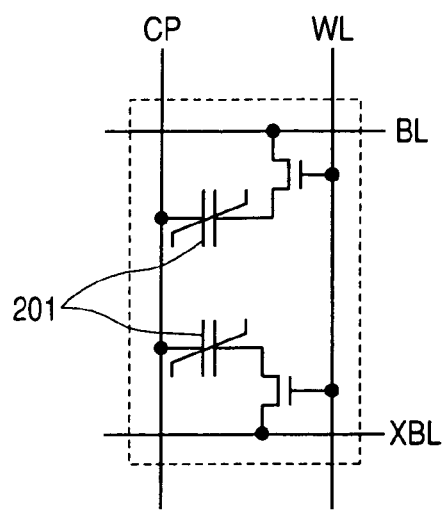
FIG. 2 is a circuit diagram of a 2T2C-type ferroelectric memory cell.

Reference numeral 101 designates a main storage area for storing ordinary data which is formed from a 2T2C ferroelectric memory cell shown in FIG. 2. Reference numeral 108 designates a redundant storage area for storing information in lieu of a faulty area (a deficient memory cell) of the main storage area 101, and, like the main storage area 101, the redundancy area 108 is formed from the 2T2C ferroelectric memory cell.

Reference numeral 103 designates a first setting function storage area for storing information about operation modes, function settings, and the like, of the semiconductor storage device 10, and the first setting function storage area is formed from the 2T2C ferroelectric memory cell shown in FIG. 2. In FIG. 2, reference numeral 201 designates ferroelectric capacitance; BL and XBL designate bit lines; WL designates a word line; and CP designates a cell plate line.

Figure 3:
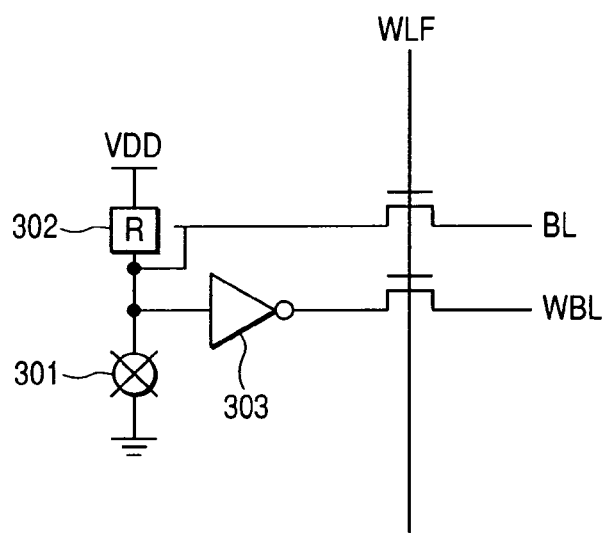
FIG. 3 is a circuit diagram of a memory cell formed from a physical fuse.

Reference numeral 102 designates a second setting function storage area for storing information about the operation modes, function settings, or the like, of the semiconductor storage device 10. The second setting function storage area is formed from a physical fuse shown in FIG. 3. The physical fuse is formed from a circuit shown in FIG. 3 and enables rewriting of data only once, by cutting physical lines with a laser trimmer. In FIG. 3, reference numeral 301 designates a physical line which can be cut by means of the laser trimmer; 302 designates a resistor element; and 303 designates a CMOS inverter.

Figure 4:
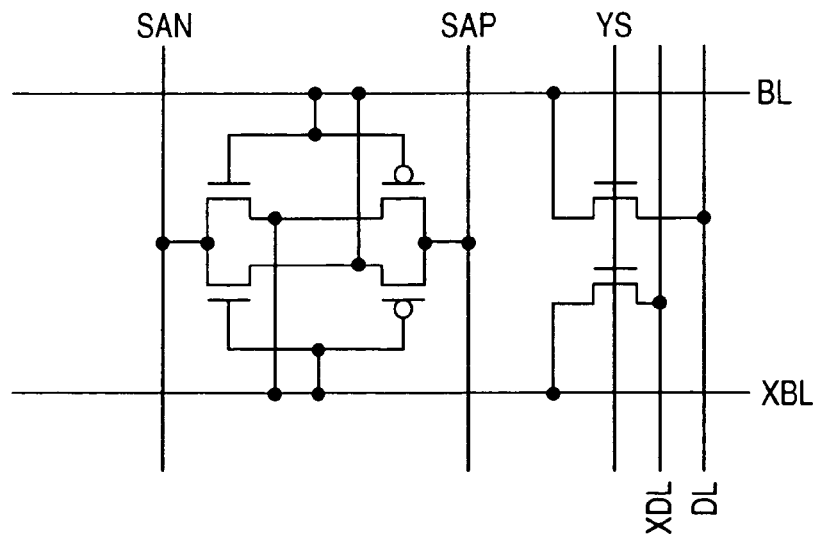
FIG. 4 is a circuit diagram of a sense amplifier.

Reference numeral 104 designates a sense amplifier which has the same configuration as that of a sense amplifier used in common DRAM and is configured from a circuit shown in FIG. 4. The sense amplifier 104 amplifies voltages of the pair of bit lines BL, XBL, which are outputs of the memory cell. In FIG. 4, SAN and SAP designate sense startup signals, and DL and XDL designate data buses.

The first setting function storage area 103 and the second setting function storage area 102 are each split into a plurality of areas. For instance, in the embodiment shown in FIG. 1, the area 102 is divided into two areas 102A, 102B, and the area 103 is divided into two areas 103A, 103B. The areas 102A, 103A store faulty address information, and the areas 102B, 103B store operation modes.

Figure 5:
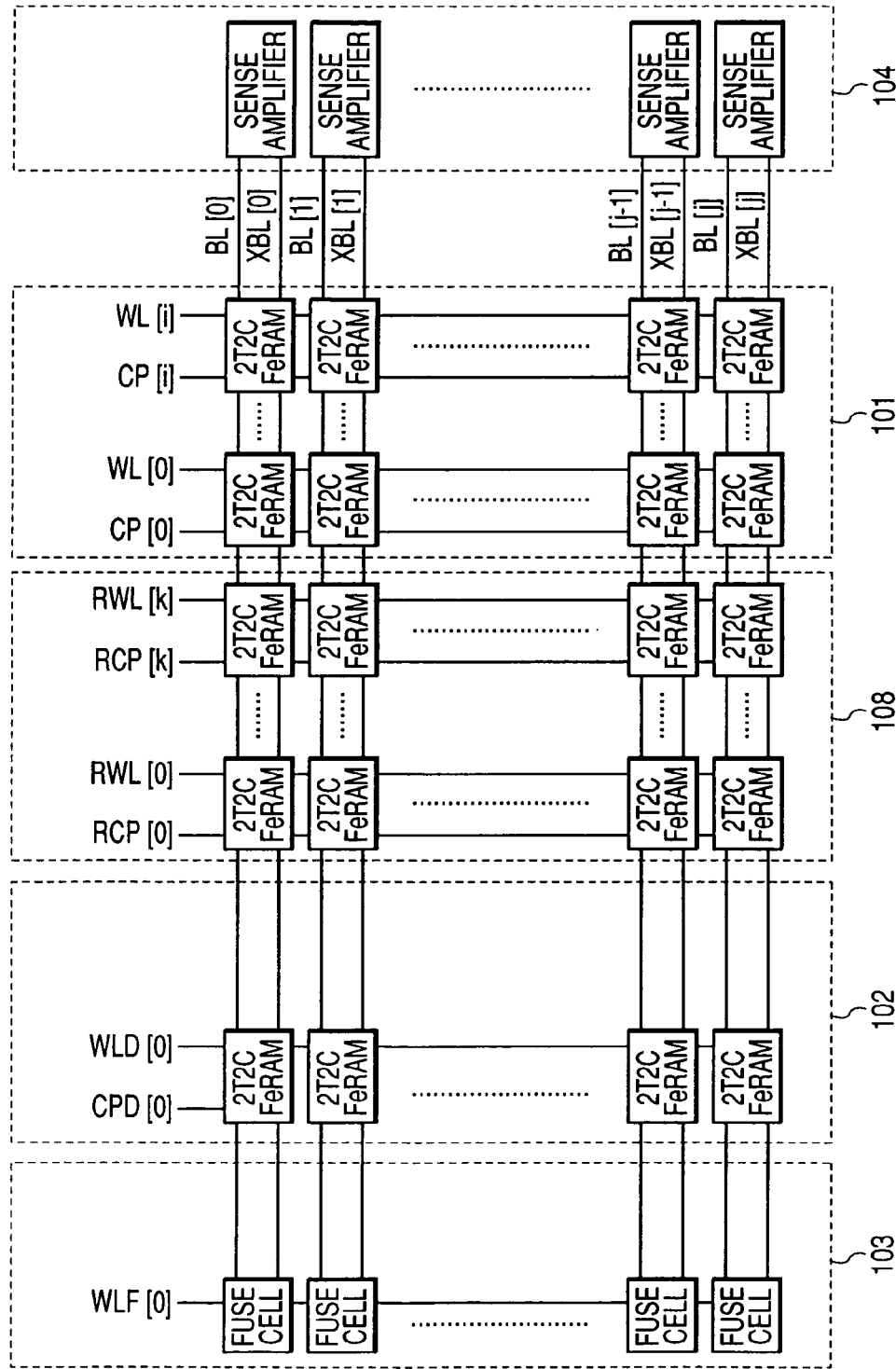
FIG. 5 is a view showing the configuration of a memory cell array section shown in FIG. 1.

As shown in FIG. 5, the previously-described two types of memory are arranged in a two-dimensional matrix configuration within the memory cell array section 11 formed from the individual sections set forth. The memory cell array section 11 is formed from the second setting function storage area 102 formed from a physical fuse in a number of 1×j; the first setting function storage area 103 formed from ferroelectric memory in a number of 1×j; the main storage area 101 which is formed from ferroelectric memory in a number of i×j and stores ordinary data; a redundant storage area 108 formed from ferroelectric memory in a number of k×j; and the sense amplifier 104 in a number of 1×j.

The peripheral circuit section 12 that performs input/output of data into/from the memory cell array section 11 of the previously-described nonvolatile memory and memory control is formed from the individual sections shown in FIG. 1.

Reference numeral 110 designates an operation mode register for temporarily storing operation mode settings; and 111 designates a faulty address register for temporarily storing faulty address information.

Reference numeral 112 designates a memory control circuit. The memory control circuit 112 controls reading/writing of data in/from the memory cell array section 11, transfer (transfer A) of data pertaining to the area 102A or 103A to the faulty address register 111, and transfer (transfer B) of data pertaining to the area 102B or 103B to the operation mode register 110.

Reference numeral 113 designates a command decoder which generates an internal control signal by means of ascertaining an external control signal.

Reference numeral 114 designates an address decoder for decoding an external address; 115 designates a data input/output circuit which acquires external data and outputs data; and 116 designates a decoder for outputting a selection signal to be used for selecting, for transfer A or B, a transfer source.

Figure 6:
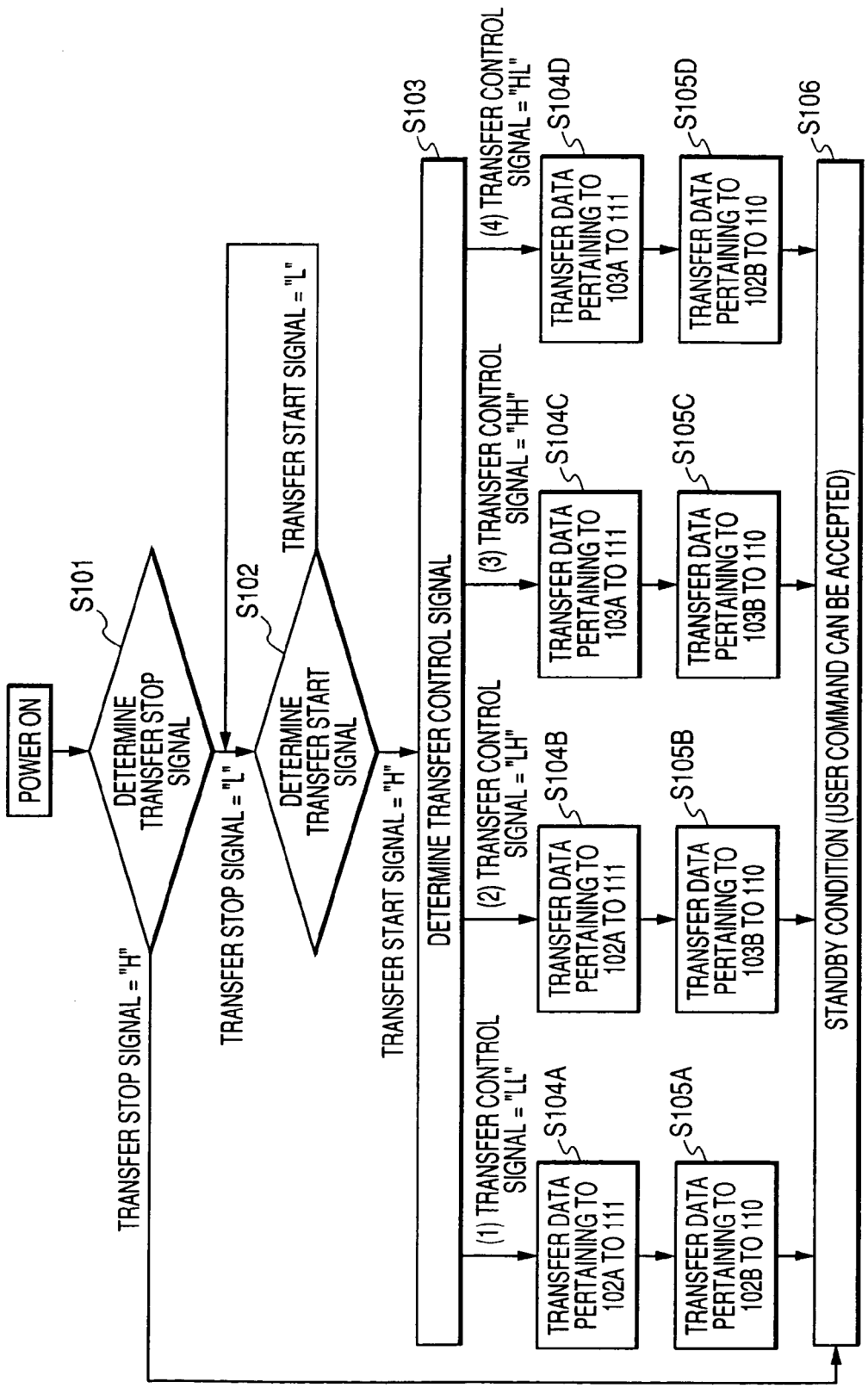
FIG. 6 is a flowchart for describing transfer of faulty address data and operation for setting an operation mode, both of which are performed in the semiconductor storage device according to the first embodiment of the present invention.

Next, a flowchart shown in FIG. 6 will be used to describe a flow along which are set transfer of faulty address data in the semiconductor storage device 10 of the present embodiment acquired after power-on and setting of an operation mode.

Desired data are written in advance in the areas 102A, 102B, 103A, and 103B.

After power has been turned on while a transfer stop signal and a transfer start signal are held at "L," the transfer start signal is brought to "H." Thereby, the transfer stop signal is determined to be "L" through transfer stop signal determination (S101). The transfer start signal is determined to be "H" through transfer start signal determination (S102), and transfer of desired data is commenced.

Next, the transfer selection signal is determined through transfer control signal determination (S103).

The transfer selection signal is formed from a combination of a faulty address data transfer selection signal ("L" or "H") and an operation mode transfer selection signal ("L" or "H"), and four possible transfer selection signals are available; that is, (1) "LL," (2) "LH," (3) "HH," and (4) "HL" (in sequence of "faulty address data" and "operation mode").

When (1) "LL" or (2) "LH" is taken as the transfer selection signal, the faulty address transfer selection signal is "L." Hence, data pertaining to the area 102A are transferred to the faulty address register 111 (S104A, S104B).

In the case of (1) "LL," the operation mode transfer selection signal is "L." Hence, the data pertaining to the area 102B are transferred to the operation mode register 110 (S105A).

Meanwhile, in the case of (2) "LH," the operation mode transfer selection signal is "H." Hence, the data pertaining to the area 103B are transferred to the operation mode register 110 (S105B).

When (3) "HH" or (4) "HL" is taken as the transfer selection signal, the faulty address transfer selection signal is "H." Hence, data pertaining to the area 103A are transferred to the faulty address register 111 (S104C, S104D).

In the case of (3) "HH," the operation mode transfer selection signal is "H." Hence, the data pertaining to the area 103B are transferred to the operation mode register 110 (S105C).

Meanwhile, in the case of (4) "HL," the operation mode transfer selection signal is "L." Hence, the data pertaining to the area 102B are transferred to the operation mode register 110 (S105D).

In accordance with the combination of the transfer selection signals, data are transferred from the areas 102A, 102B, 103A, and 104B to the operation mode register 110 and the faulty address register 111. As a result, setting of a desired operation mode and replacement of a faulty area are performed, so that a state shifts to a standby condition where the semiconductor storage device can accept a user command (S106).

The case of (1) "LL" corresponds to a case where the faulty address data and the operation mode data are stored in the physical fuse. This case is suitable for, e.g., a high-security semiconductor storage device which prevents the user from rewriting operation mode data and faulty address data.

The case of (2) "LH" corresponds to a case where the faulty address data are stored in the physical fuse and the operation mode data are stored in electrically-rewritable nonvolatile memory (ferroelectric memory). By means of this, for instance, the memory cell in the faulty area can be replaced with high reliability, and this case can be applied to a semiconductor storage device which enables flexible setting of an operation mode.

The case of (3) "HH" corresponds to a case where the faulty address data and the operation mode data are stored in the electrically-rewritable nonvolatile memory (the ferroelectric memory). For instance, this case is applied to a highly-flexible semiconductor storage device which has a high degree of freedom in replacement of a memory cell in a faulty area after assembly and enables flexible setting of an operation mode.

The case of (4) "HL" corresponds to a case where the faulty address data are stored in the electrically-rewritable nonvolatile memory (the ferroelectric memory) and the operation mode data are stored in the physical fuse. This case can be applied to a high-security semiconductor storage device which has a high degree of freedom in replacement of a memory cell in the faulty area and which prevents the user from rewriting operation mode data.

Figure 7:
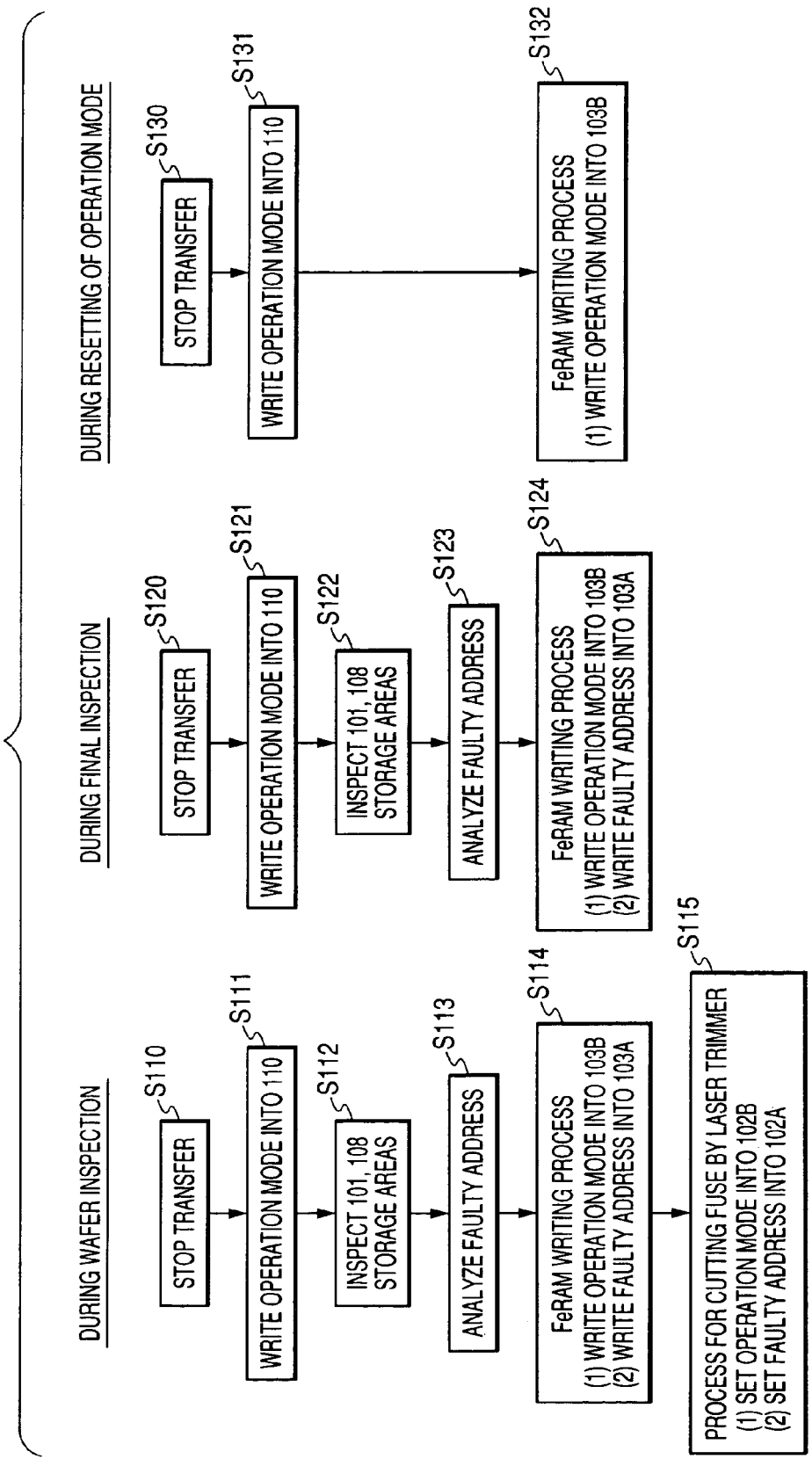
FIG. 7 is a view for describing an inspection flow of the semiconductor storage device according to the first embodiment of the present invention.

An example inspection flow is shown in FIG. 7 and will now be described.

At the time of inspection of a wafer, the transfer stop signal is brought to "H," and the transfer start signal is brought to "L" (transfer stop: S110). After power-on, initialization is performed, and desired operation mode data are written into the operation mode register 110 (S1).

Next, the main storage area 101 and the redundant storage area 108 are subjected to memory inspection (S112) and faulty address analysis (S113). The operation mode data in the operation mode register 110 are written into the area 103B, and the faulty address is written into the area 103A (S114).

Processing pertaining to a fuse cutting process is performed by means of a laser trimmer (S115), and setting of the faulty address into the area 102B and setting of the operation mode into the area 102A are performed.

When the memory cell in the faulty area is again replaced through final inspection, the transfer stop signal is brought to "H," and the transfer start signal is brought to "L" (transfer stop: S120). After power-on, initialization is performed, and desired operation mode data are written into the operation mode register 110 (S121).

Next, the main storage area 101 and the redundant storage area 108 are subjected to memory inspection (S122) and faulty address analysis (S123). The operation mode is written into the area 103B, and the faulty address is written into the area 103A (S124).

When the user sets the operation mode again, the transfer stop signal is brought to "H," and the transfer start signal is brought to "L" (transfer stop: S130). After power-on, initialization is performed, and desired operation mode data are written into the operation mode register 110 (S131).

Next, a desired operation mode is written into the area 103B (S132).

The present embodiment has illustrated, as an example configuration of the memory cell array section, an exemplary combination of the physical fuse and the ferroelectric memory. However, a combination of fuse memory, which breaks an insulation film, with EPPROM can easily be applied to the configuration of the memory cell array section.

It is also easy to provide the memory cell array section with a plurality of areas corresponding to the areas 102B, 103B, to thus increase the degree of freedom of operation mode selection.

(Second Embodiment)

Figure 8:
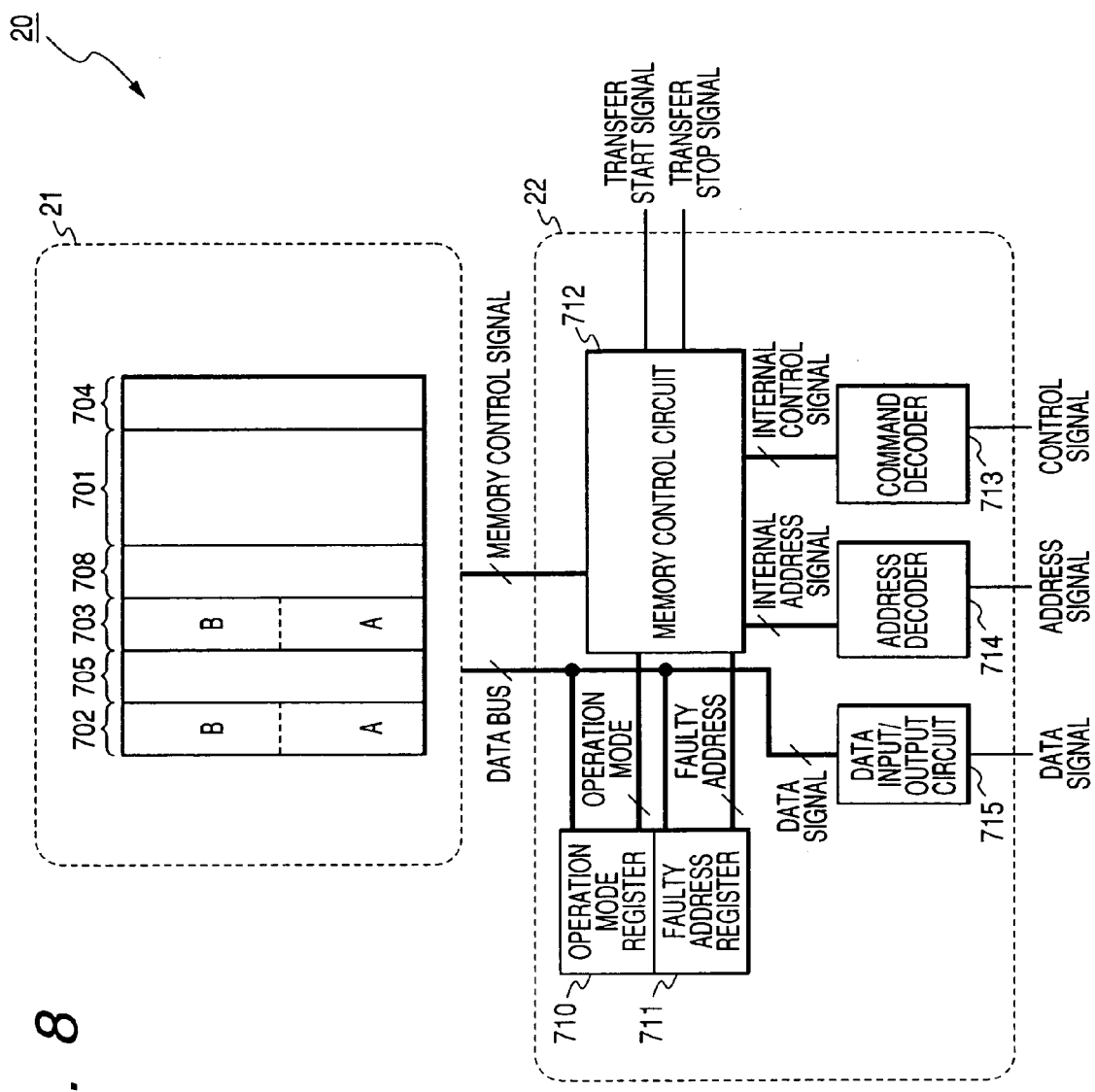
FIG. 8 is a block diagram showing the configuration of a semiconductor storage device according to a second embodiment of the present invention.

FIG. 8 is a block diagram showing the configuration of a semiconductor storage device 20 according to a second embodiment of the present invention; that is, a configuration using a physical fuse and ferroelectric memory (FeRAM) as nonvolatile memory.

As shown in FIG. 8, the semiconductor storage device 20 is made up of a memory cell array section 21 formed from nonvolatile memory, and a peripheral circuit section 22 for enabling input/output of data into/from the memory cell array section 21 and memory control.

The memory cell array section 21 is made up of a physical fuse and ferroelectric memory, and individual sections of the configuration will be described below.

Reference numeral 701 designates a main storage area for storing ordinary data which is formed from the 2T2C ferroelectric memory cell, as in the case of the first embodiment (see FIG. 2). Reference numeral 708 designates a redundant storage area for storing information in lieu of a faulty area (a deficient memory cell) of the main storage area 701, and, like the main storage area 701, the redundancy area 708 is formed from the 2T2C ferroelectric memory cell.

Reference numeral 703 designates a first setting function storage area for storing information about operation modes, function settings, and the like, of the semiconductor storage device 20, and, as in the case of the first embodiment, the first setting function storage area is formed from the 2T2C ferroelectric memory cell.

Reference numeral 702 designates a second setting function storage area for storing information about the operation modes, function settings, or the like, of the semiconductor storage device 20. As in the case of the first embodiment, the second setting function storage area is formed from a physical fuse (see FIG. 3).

Reference numeral 704 designates a sense amplifier (see FIG. 4).

The first setting function storage area 703 and the second setting function storage area 702 are each split into a plurality of areas. For instance, in the embodiment shown in FIG. 8, the area 702 is divided into two areas 702A, 702B, and the area 703 is divided into two areas 703A, 703B. The areas 702A, 703A store faulty address information, and the areas 702B, 703B store operation modes.

Reference numeral 705 designates a transfer specification information storage area for storing information to be used for specifying transfer sources for the areas 702A, 702B, 703A, and 703B, and the transfer specification information storage area 703 is formed from a physical fuse.

Figure 9:
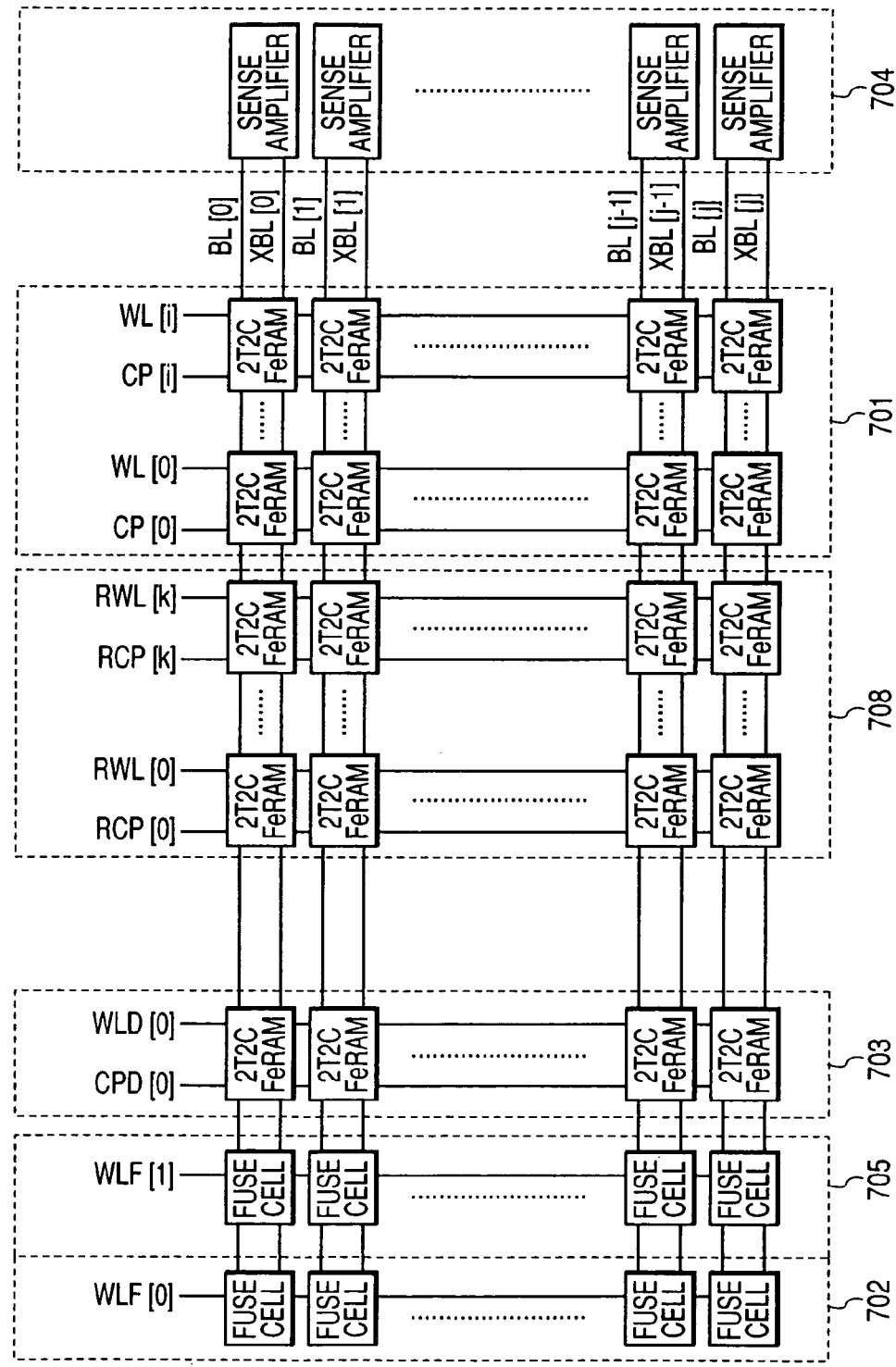
FIG. 9 is a view showing the configuration of the memory cell array section shown in FIG. 8.

As shown in FIG. 9, the previously-described two types of memory are arranged in a two-dimensional matrix configuration within the memory cell array section 21 formed from the individual sections set forth. The memory cell array section 21 is formed from the second setting function storage area 702 and the transfer specification information storage area 705, which are each formed from a physical fuse in a number of 2×j; the first setting function storage area 703 formed from ferroelectric memory in a number of 1×j; the main storage area 701 which is formed from ferroelectric memory in a number of i×j and stores ordinary data; the redundant storage area 708 formed from ferroelectric memory in a number of k×j; and the sense amplifier 704 in a number of 1×j.

The peripheral circuit section 22 that performs input/output of data into/from the memory cell array section 21 of the previously-described nonvolatile memory and memory control is formed from the individual sections shown in FIG. 8.

Reference numeral 710 designates an operation mode register for temporarily storing operation mode settings; and 711 designates a faulty address register for temporarily storing faulty address information.

Reference numeral 712 designates a memory control circuit. The memory control circuit 712 controls reading/writing of data in/from the memory cell array section 21, transfer (transfer A) of data pertaining to the area 702A or 703A to the faulty address register 711, and transfer (transfer B) of data pertaining to the area 702B or 703B to the operation mode register 710.

Reference numeral 713 designates a command decoder which generates an internal control signal by means of ascertaining an external control signal.

Reference numeral 714 designates an address decoder for decoding an external address; and 715 designates a data input/output circuit which acquires external data and outputs data.

Figure 10:
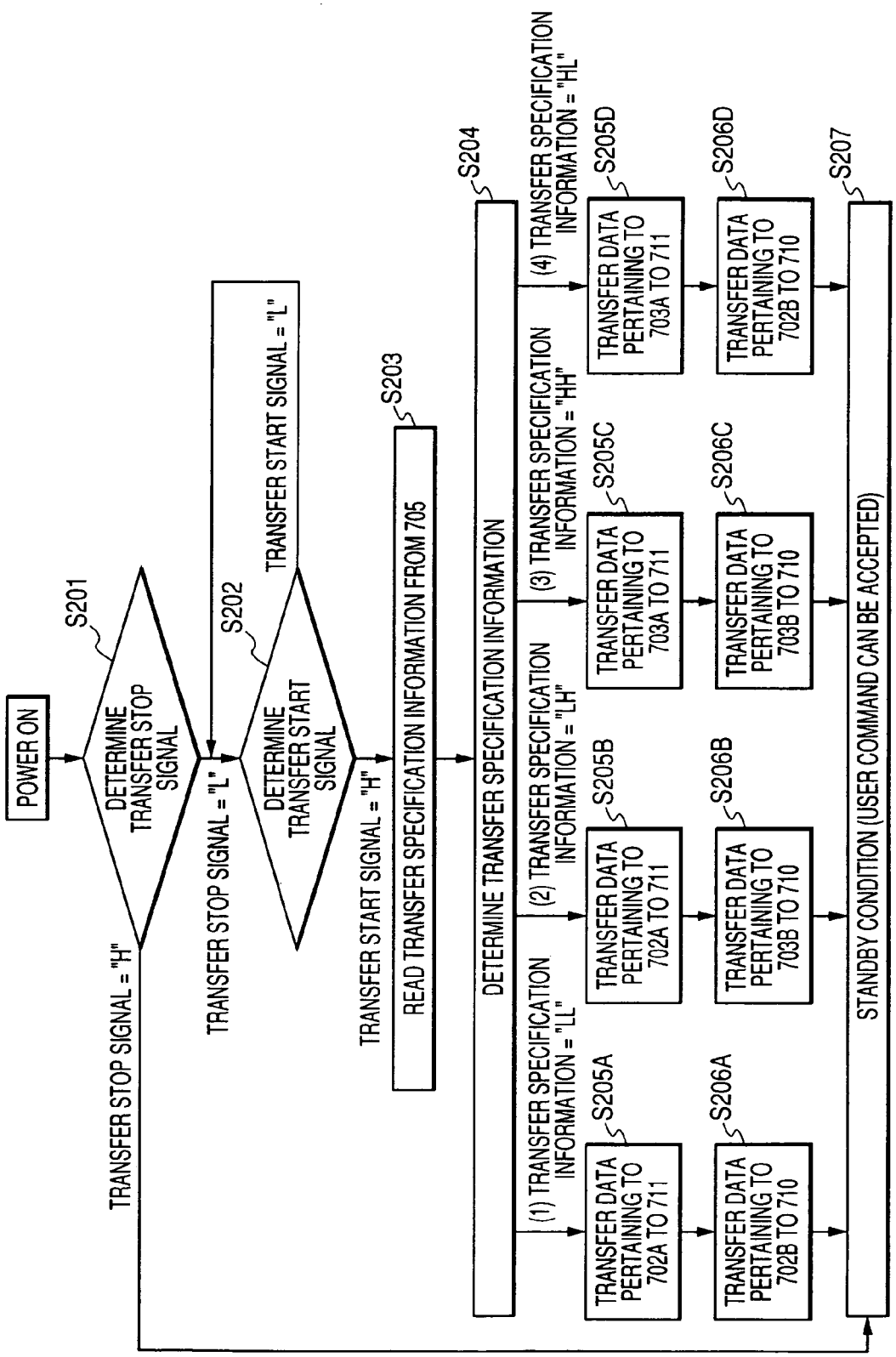
FIG. 10 is a flowchart for describing transfer of faulty address data and operation for setting an operation mode, both of which are performed in the semiconductor storage device according to the second embodiment of the present invention.

Next, FIG. 10 will be used to describe a flow along which are set transfer of faulty address data in the semiconductor storage device 20 of the present embodiment acquired after power-on and setting of an operation mode.

Desired data are written in advance in the areas 702A, 702B, 703A, 703B, and 705.

After power has been turned on while the transfer stop signal and the transfer start signal are held at "L," the transfer start signal is brought to "H." Thereby, the transfer stop signal is determined to be "L" through transfer stop signal determination (S201). The transfer start signal is determined to be "H" through transfer start signal determination (S202), and transfer specification information is read from the transfer specification information storage area 705 (S203).

Next, the thus-read transfer selection signal is determined through transfer specification information determination (S204).

The transfer specification information is formed from a combination of faulty address data transfer specification information ("L" or "H") and operation mode transfer specification information ("L" or "H"), and four possible types of transfer specification information items are available; that is, (1) "LL," (2) "LH," (3) "HH," and (4) "HL" (in sequence of "faulty address data" and "operation mode").

When (1) "LL" or (2) "LH" is taken as the transfer specification information, the faulty address transfer specification information is "L." Hence, data pertaining to the area 702A are transferred to the faulty address register 711 (S205A, S205B).

In the case of (1) "LL," the operation mode transfer specification information is "L." Hence, the data pertaining to the area 702B are transferred to the operation mode register 710 (S206A).

Meanwhile, in the case of (2) "LH," the operation mode transfer specification information is "H." Hence, the data pertaining to the area 703B are transferred to the operation mode register 710 (S206B).

When (3) "HH" or (4) "HL" is taken as the transfer specification information, the faulty address transfer specification information is "H." Hence, data pertaining to the area 703A are transferred to the faulty address register 711 (S205C, S205D).

In the case of (3) "HH," the operation mode transfer specification information is "H." Hence, the data pertaining to the area 703B are transferred to the operation mode register 710 (S206C).

Meanwhile, in the case of (4) "HL," the operation mode transfer specification information is "L." Hence, the data pertaining to the area 702B are transferred to the operation mode register 710 (S206D).

In accordance with the combination of the transfer specification information items, data are transferred from the areas 702A, 702B, 703A, and 704B to the operation mode register 110 and the faulty address register 711. As a result, setting of a desired operation mode and replacement of a faulty area are performed, so that a state shifts to a standby condition where the semiconductor storage device can accept a user command (S207).

The case of (1) "LL" corresponds to a case where the faulty address data and the operation mode data are stored in the physical fuse. This case is suitable for, e.g., a high-security semiconductor storage device which prevents the user from rewriting operation mode data and faulty address data.

The case of (2) "LH" corresponds to a case where the faulty address data are stored in the physical fuse and the operation mode data are stored in electrically-rewritable nonvolatile memory (ferroelectric memory). By means of this, for instance, the memory cell in the faulty area can be replaced with high reliability, and this case can be applied to a semiconductor storage device which enables flexible setting of an operation mode.

The case of (3) "HH" corresponds to a case where the faulty address data and the operation mode data are stored in the electrically-rewritable nonvolatile memory (the ferroelectric memory). For instance, this case is applied to a highly-flexible semiconductor storage device which has a high degree of freedom in replacement of a memory cell in a faulty area after assembly and enables flexible setting of an operation mode.

The case of (4) "HL" corresponds to a case where the faulty address data are stored in the electrically-rewritable nonvolatile memory (the ferroelectric memory) and where the operation mode data are stored in the physical fuse. This case can be applied to a high-security semiconductor storage device which has a high degree of freedom in replacement of a memory cell in the faulty area and which prevents the user from rewriting operation mode data.

Figure 11:
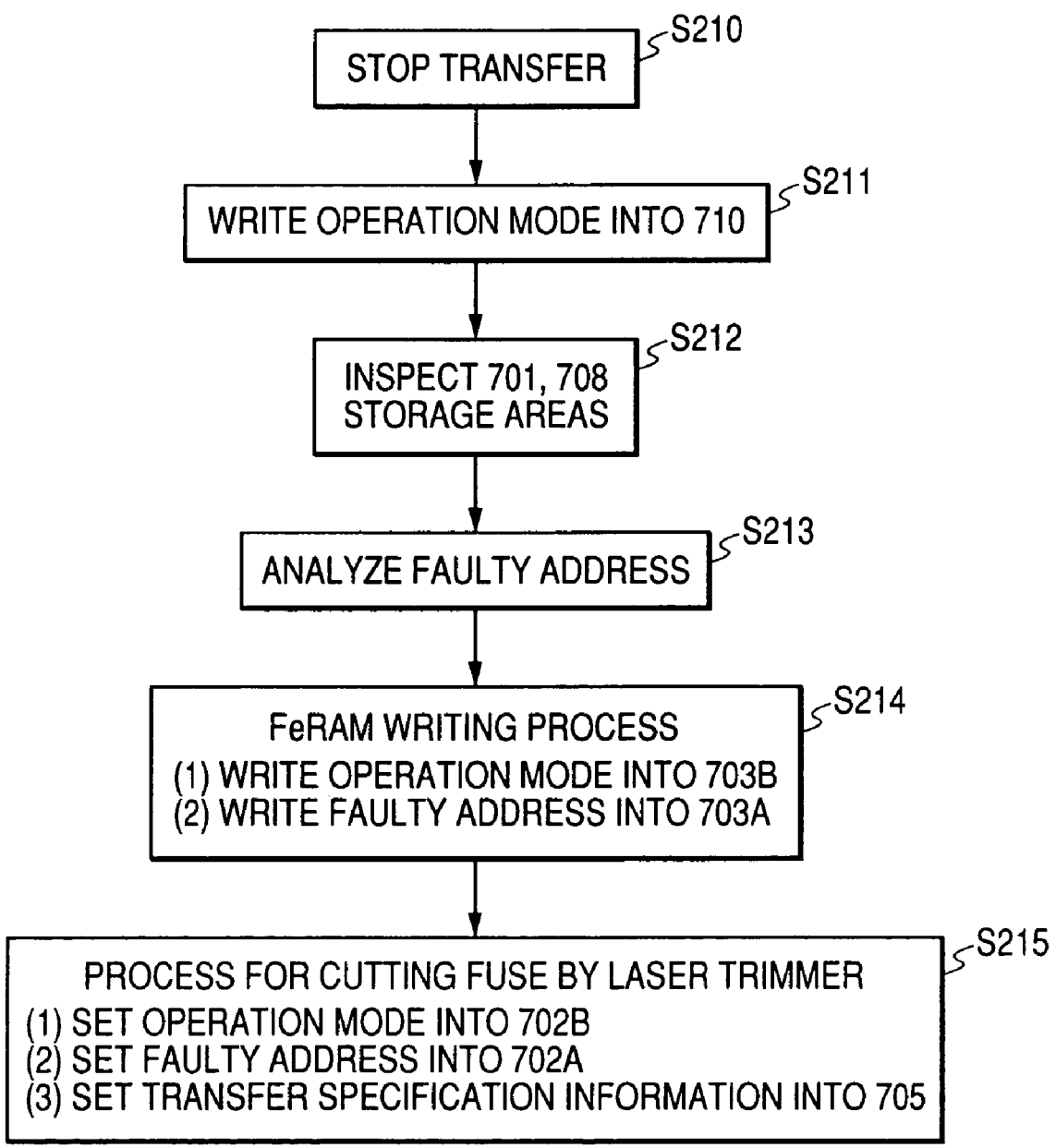
FIG. 11 is a view for describing an inspection flow of the semiconductor storage device according to the second embodiment of the present invention.

An example inspection flow is shown in FIG. 11.

At the time of inspection of a wafer, the transfer stop signal is brought to "H," and the transfer start signal is brought to "L" (transfer stop: S210). After power-on, initialization is performed, and desired operation mode data are written into the operation mode register 710 (S211).

Next, the main storage area 701 and the redundant storage area 708 are subjected to memory inspection (S212) and faulty address analysis (S213). The operation mode data in the operation mode register 710 are written into the area 703B, and the faulty address is written into the area 703A (S214).

Processing pertaining to a fuse cutting process is performed by means of a laser trimmer, and setting of the faulty address into the area 702B and setting of the operation mode into the area 702A are performed. Moreover, transfer specification information is set in the transfer specification information storage area 705 (S215).

The present embodiment has illustrated, as an example configuration of the memory cell array section, an exemplary combination of the physical fuse and the ferroelectric memory. However, a combination of fuse memory, which breaks an insulation film, with EPPROM can easily be applied to the configuration of the memory cell array section.

It is also easy to provide the memory cell array section with a plurality of areas corresponding to the areas 702B, 703B, to thus increase the degree of freedom of operation mode selection.

(Third Embodiment)

Figure 12:
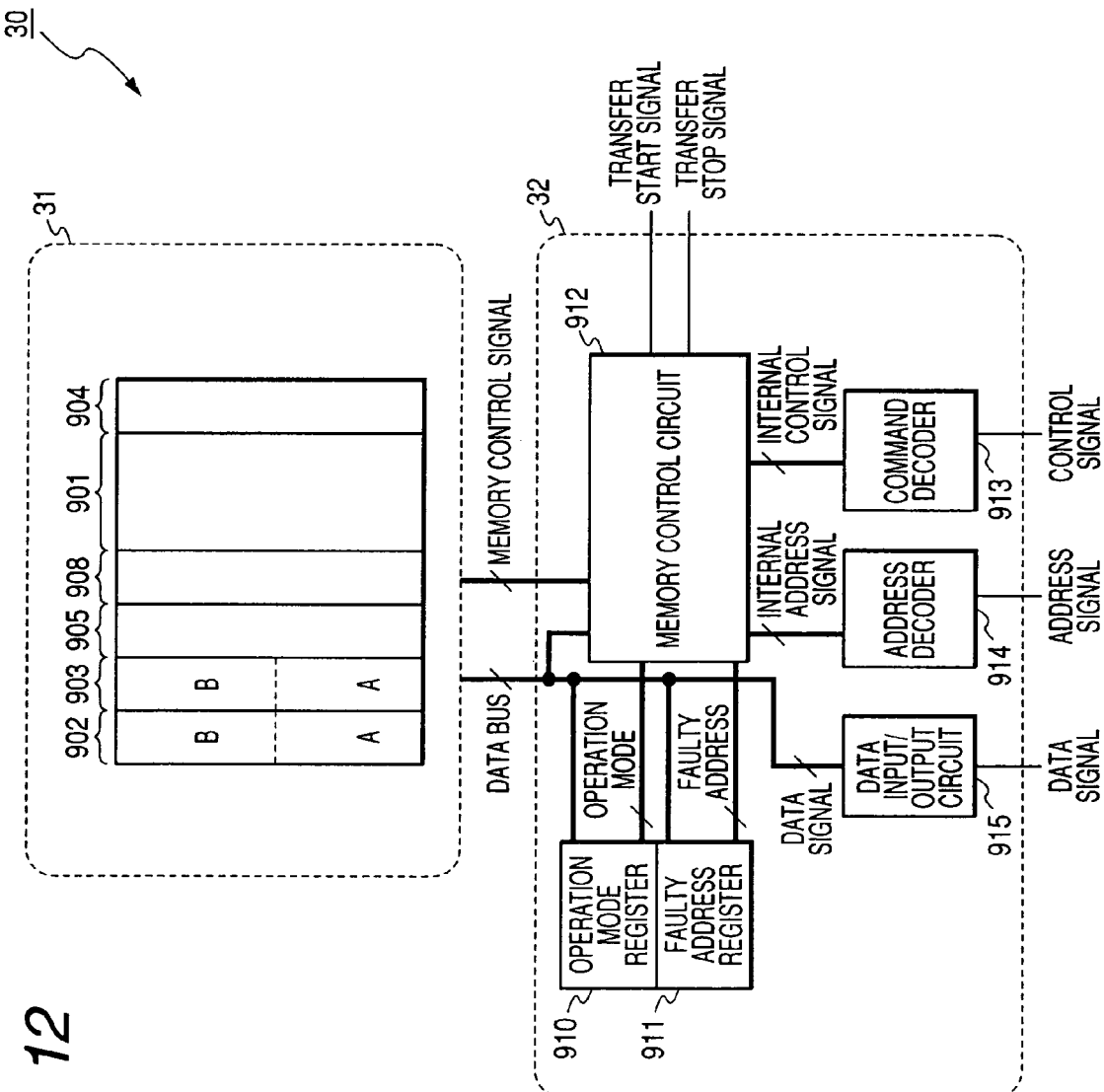
FIG. 12 is a block diagram showing the configuration of a semiconductor storage device according to a third embodiment of the present invention.

FIG. 12 is a block diagram showing the configuration of a semiconductor storage device 30 according to a third embodiment of the present invention; that is, a configuration using a physical fuse and ferroelectric memory (FeRAM) as nonvolatile memory.

As shown in FIG. 12, the semiconductor storage device 30 is made up of a memory cell array section 31 formed from nonvolatile memory, and a peripheral circuit section 32 for enabling input/output of data into/from the memory cell array section 31 and memory control.

The memory cell array section 31 is made up of a physical fuse and ferroelectric memory, and individual sections of the configuration will be described below.

Reference numeral 901 designates a main storage area for storing ordinary data which is formed from the 2T2C ferroelectric memory cell, as in the case of the first embodiment (see FIG. 2). Reference numeral 908 designates a redundant storage area for storing information in lieu of a faulty area (a deficient memory cell) of the main storage area 901, and, like the main storage area 901, the redundancy area is formed from the 2T2C ferroelectric memory cell.

Reference numeral 903 designates a first setting function storage area for storing information about operation modes, function settings, and the like, of the semiconductor storage device 30, and, as in the case of the first embodiment, the first setting function storage area is formed from the 2T2C ferroelectric memory cell.

Reference numeral 902 designates a second setting function storage area for storing information about the operation modes, function settings, or the like, of the semiconductor storage device 30. As in the case of the first embodiment, the second setting function storage area is formed from a physical fuse (see FIG. 3).

Reference numeral 904 designates a sense amplifier (see FIG. 4).

The first setting function storage area 903 and the second setting function storage area 902 are each split into a plurality of areas. For instance, in the embodiment shown in FIG. 12, the area 902 is divided into two areas 902A, 902B, and the area 903 is divided into two areas 903A, 903B. The areas 902A, 903A store faulty address information, and the areas 902B, 903B store operation modes.

Reference numeral 905 designates a transfer specification information storage area for storing information to be used for specifying transfer sources for the areas 902A, 902B, 903A, and 903B, and the transfer specification information storage area is formed from a ferroelectric memory cell of 2T2C type.

Figure 13:
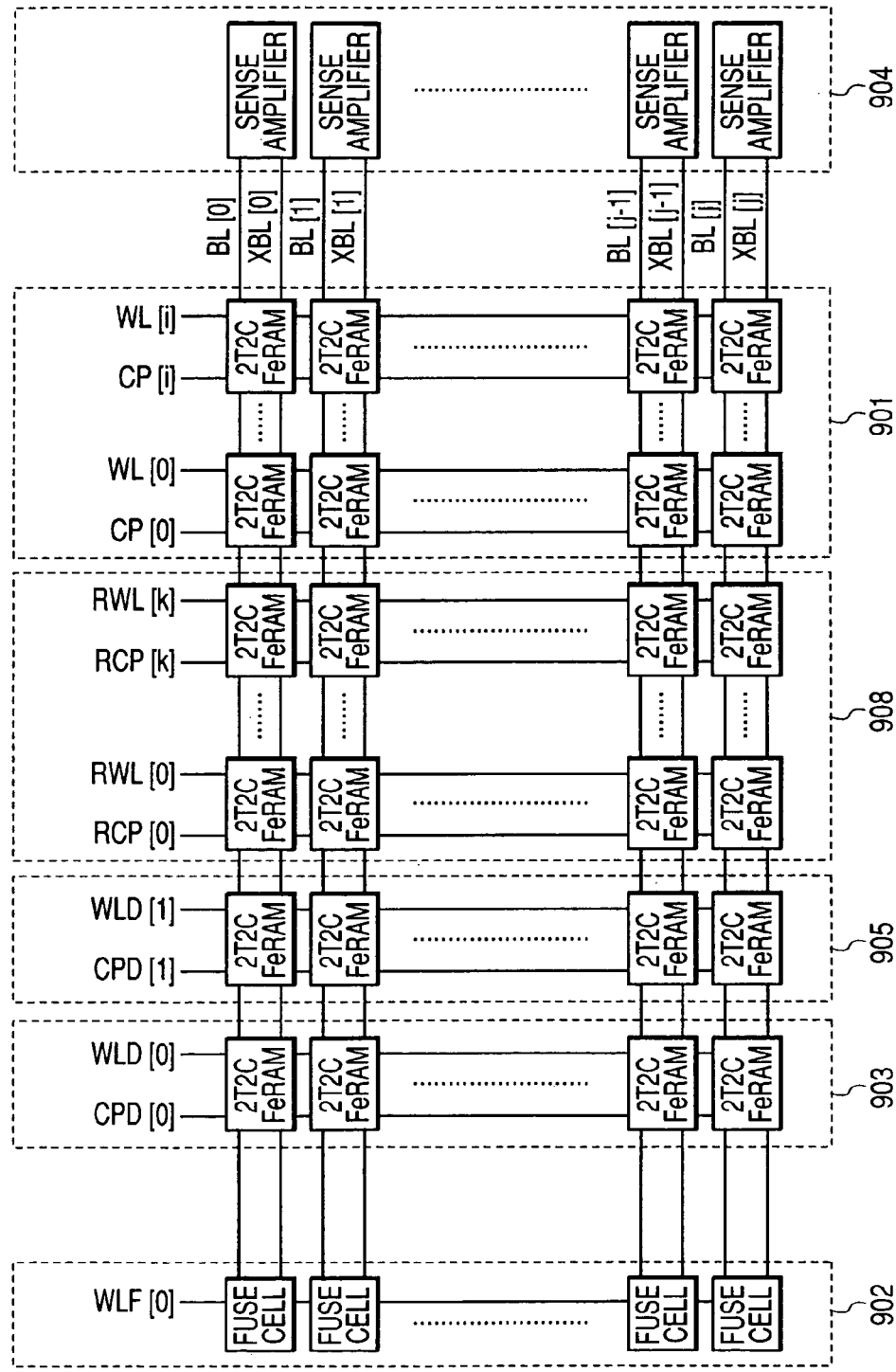
FIG. 13 is a view showing the configuration of the memory cell array section shown in FIG. 12.

As shown in FIG. 13, the previously-described two types of memory are arranged in a two-dimensional matrix configuration within the memory cell array section 31 formed from the individual sections set forth. The memory cell array section 31 is formed from the second setting function storage area 902 formed from a physical fuse in a number of 1×j; the first setting function storage area 903 and the transfer specification information storage area 905, each formed from ferroelectric memory in a number of 2×j; the main storage area 901 which is formed from ferroelectric memory in a number of i×j and stores ordinary data; the redundant storage area 908 formed from ferroelectric memory in a number of k×j; and the sense amplifier 904 in a number of 1×j.

The peripheral circuit section 32 that performs input/output of data into/from the memory cell array section 31 of the previously-described nonvolatile memory and memory control is formed from the individual sections shown in FIG. 12.

Reference numeral 910 designates an operation mode register for temporarily storing operation mode settings; and 911 designates a faulty address register for temporarily storing faulty address information.

Reference numeral 912 designates a memory control circuit. The memory control circuit 912 controls reading/writing of data in/from the memory cell array section 31, transfer (transfer A) of data pertaining to the area 902A or 903A to the faulty address register 911, and transfer (transfer B) of data pertaining to the area 902B or 903B to the operation mode register 910.

Reference numeral 913 designates a command decoder which generates an internal control signal by means of ascertaining an external control signal.

Reference numeral 914 designates an address decoder for decoding an external address; and 915 designates a data input/output circuit which acquires external data and outputs data.

Figure 14:
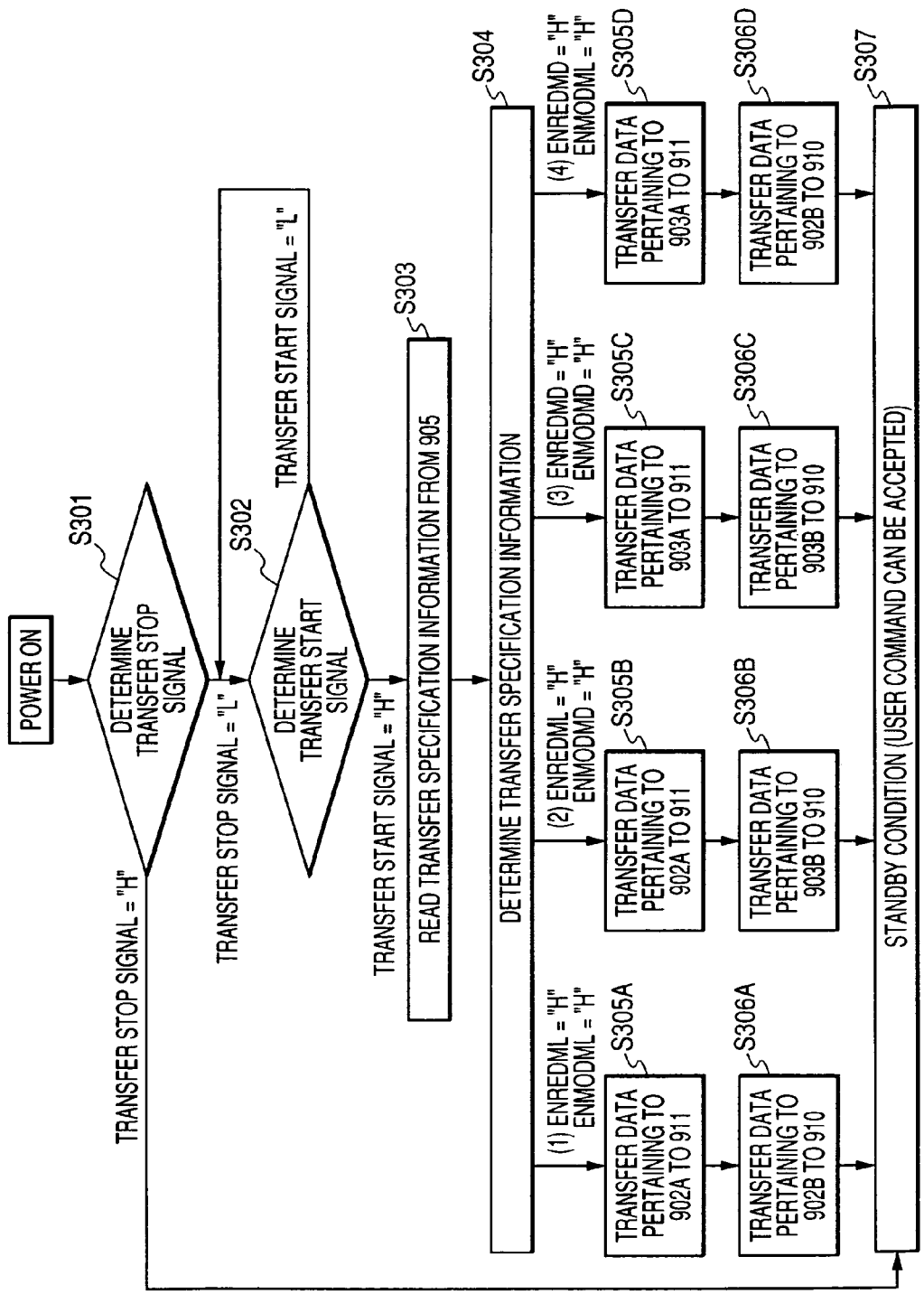
FIG. 14 is a flowchart for describing transfer of faulty address data and operation for setting an operation mode, both of which are performed in the semiconductor storage device according to the third embodiment of the present invention.

Next, a flowchart shown in FIG. 14 will be used to describe a flow along which are set transfer of faulty address data in the semiconductor storage device 30 of the present embodiment acquired after power-on and setting of an operation mode.

Desired data are written in advance in the areas 902A, 902B, 903A, 903B, and 905.

After power has been turned on while the transfer stop signal and the transfer start signal are held at "L," the transfer start signal is brought to "H." Thereby, the transfer stop signal is determined to be "L" through transfer stop signal determination (S301). The transfer start signal is determined to be "H" through transfer start signal determination (S302), and transfer specification information is read from the transfer specification information storage area 905 (S303).

Next, the thus-read transfer selection signal is determined through transfer specification information determination (S304).

Figure 16:
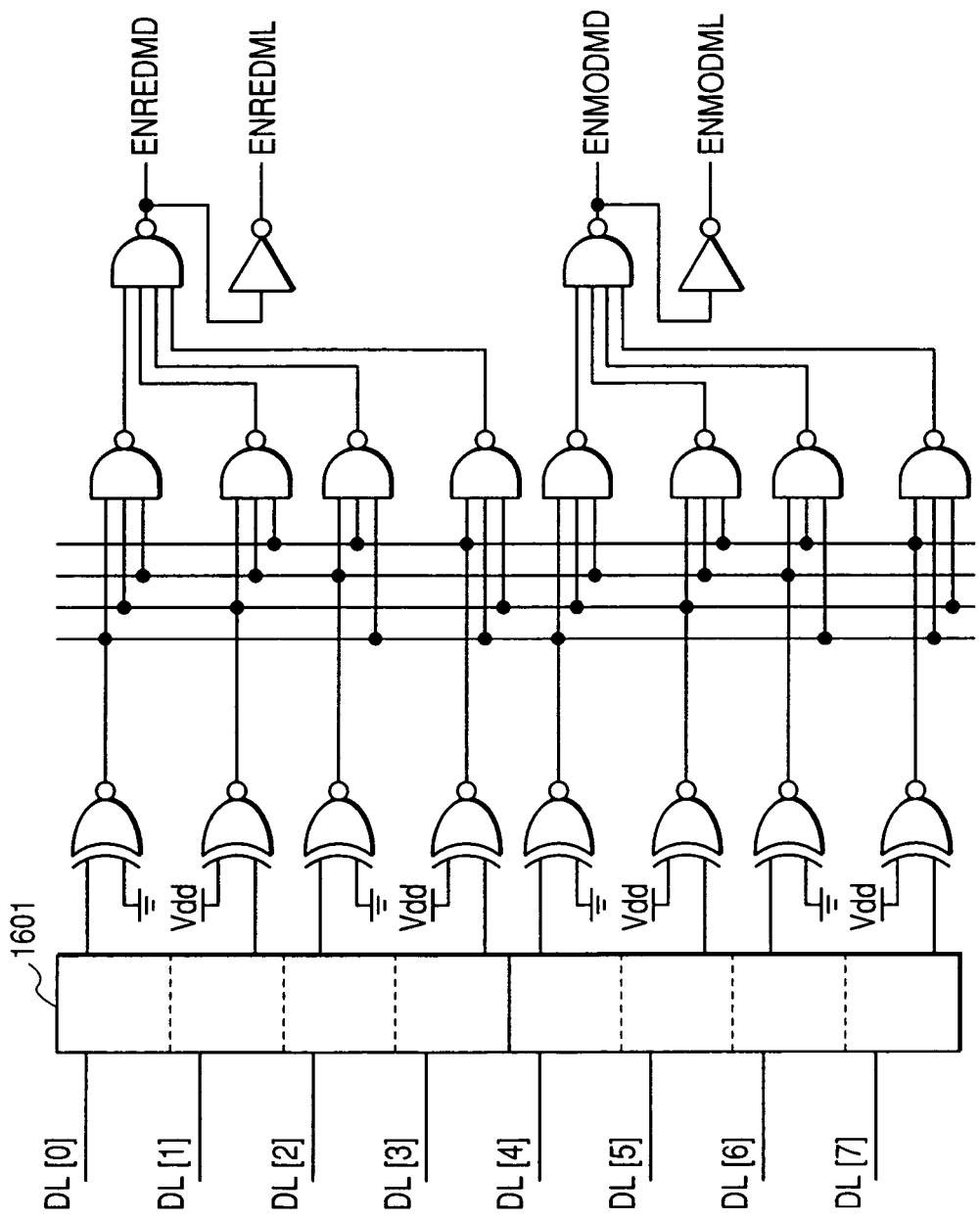
FIG. 16 is a circuit diagram of a transfer specification data determination circuit in the semiconductor storage device according to the third embodiment of the present invention.

The transfer specification information determination (S304) is for determining the data read from the memory cell array section 31 by means of the data determination circuit shown in FIG. 16.

Reference numeral 1601 designates an 8-bit register, and this register 1601 acquires data from the data line DL and temporarily stores the data.

The transfer specification information determination is performed on a four-bit basis. Transfer specification information about the faulty address data is determined at lower four bits DL [3:0], and operation mode transfer specification information is determined at upper four bits DL [7:4].

If the data determination circuit finds a match in three bits of the lower four bits, ENREDMD is brought to "H" [in the cases of (3) and (4)], and data pertaining to the area 903A are transferred to the faulty address register 911.

In a case other than that mentioned above, ENREDML is brought to "H" [in the cases of (1) and (2)], and data pertaining to the area 902A are transferred to the faulty address register 911.

If a match is found in three bits of the upper four bits, ENMODMD is brought to "H" [in the cases of (2) and (3)], and data pertaining to the area 903B are transferred to the operation mode register 910.

In a case other than that mentioned above, ENMODML is brought to "H" [in the cases of (1) and (4)], and data pertaining to the area 902B are transferred to the operation mode register 910.

In accordance with the combination of the previously-described transfer specification information items, data are transferred from the areas 902A, 902B, 903A, and 903B to the operation mode register 910 and the faulty address register 911. Thereby, setting of a desired operation mode and replacement of a memory cell in a faulty area are performed, so that a state shifts to a standby condition where the semiconductor storage device can accept a user command (S307).

The case of (1) "LL" corresponds to a case where the faulty address data and the operation mode data are stored in the physical fuse. This case is suitable for, e.g., a high-security semiconductor storage device which prevents the user from rewriting operation mode data and faulty address data.

The case of (2) "LH" corresponds to a case where the faulty address data are stored in the physical fuse and the operation mode data are stored in electrically-rewritable nonvolatile memory (ferroelectric memory). By means of this, for instance, the memory cell in the faulty area can be replaced with high reliability, and this case can be applied to a semiconductor storage device which enables flexible setting of an operation mode.

The case of (3) "HH" corresponds to a case where the faulty address data and the operation mode data are stored in the electrically-rewritable nonvolatile memory (the ferroelectric memory). For instance, this case is applied to a highly-flexible semiconductor storage device which has a high degree of freedom in replacement of a memory cell in a faulty area after assembly and enables flexible setting of an operation mode.

The case of (4) "HL" corresponds to a case where the faulty address data are stored in the electrically-rewritable nonvolatile memory (the ferroelectric memory) and where the operation mode data are stored in the physical fuse. This case can be applied to a high-security semiconductor storage device which has a high degree of freedom in replacement of a memory cell in the faulty area and which prevents the user from rewriting operation mode data.

Figure 15:
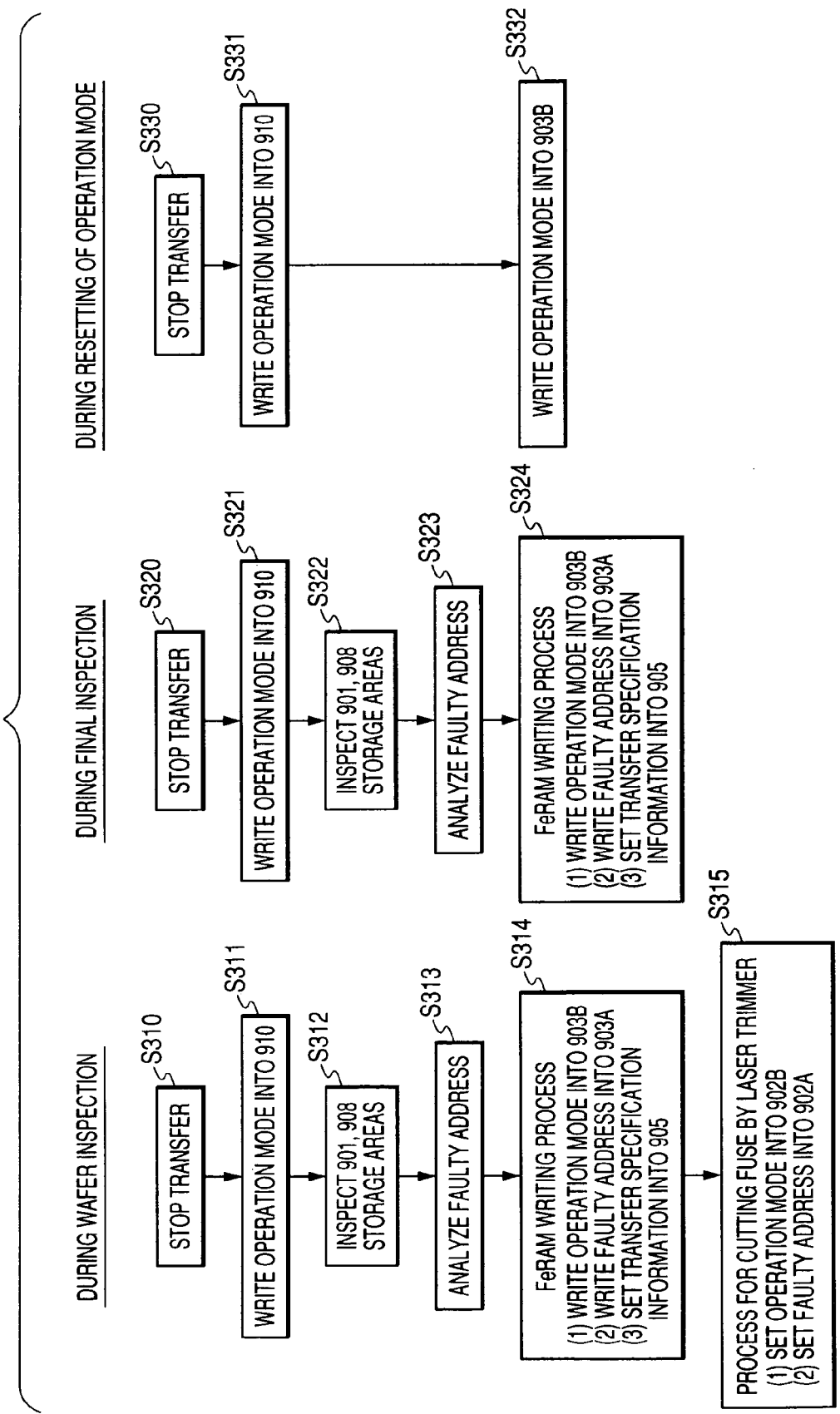
FIG. 15 is a view for describing an inspection flow of the semiconductor storage device according to the third embodiment of the present invention.

An example inspection flow is shown in FIG. 15.

At the time of inspection of a wafer, the transfer stop signal is brought to "H," and the transfer start signal is brought to "L" (transfer stop: S310). After power-on, initialization is performed, and desired operation mode data are written into the operation mode register 910 (S311).

Next, the main storage area 901 and the redundant storage area 908 are subjected to memory inspection (S312) and faulty address analysis (S313). The operation mode data in the operation mode register 910 are written into the area 903B, and the faulty address is written into the area 903A. Moreover, transfer specification information is written into the transfer specification information storage area 905 (S314).

Processing pertaining to a fuse cutting process is performed by means of a laser trimmer, and setting of the faulty address into the area 902B and setting of the operation mode into the area 902A are performed (S315).

When the memory cell in the faulty area is again replaced through final inspection, the transfer stop signal is brought to "H," and the transfer start signal is brought to "L" (transfer stop: S320). After power-on, initialization is performed, and desired operation mode data are written into the operation mode register 910 (S321).

Next, the main storage area 901 and the redundant storage area 908 are subjected to memory inspection (S322) and faulty address analysis (S323). The transfer specification information is written into the area 905 such that writing of the operation mode into the area 903B, writing of the faulty address into the area 903A, setting of transfer of data from the area 903B or 902B to the operation mode register 910, and setting of transfer of data from the area 903A to the faulty address register 911 are performed (S324).

When the user sets the operation mode again, the transfer stop signal is brought to "H," and the transfer start signal is brought to "L" (transfer stop: S330). After power-on, initialization is performed, and desired operation mode data are written into the operation mode register 910 (S331).

Subsequently, transfer specification information is written into the area 905 such that setting of transfer of data from the area 903B or 902B to the operation mode register 910 and setting of transfer of data from the area 903A to the faulty address register 911 are performed (S332).

(Fourth Embodiment)

Figure 17:
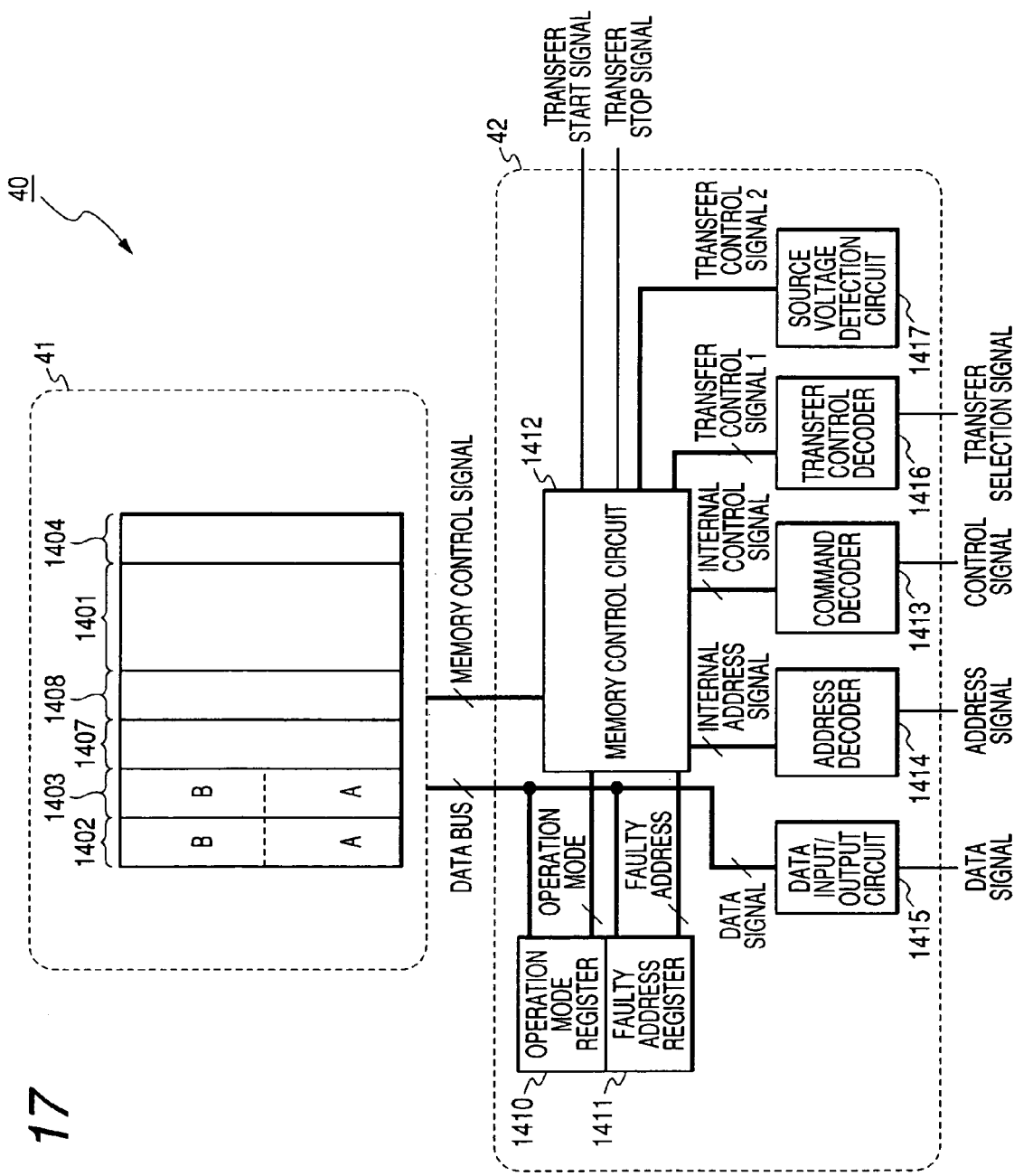
FIG. 17 is a block diagram showing the configuration of a semiconductor storage device according to a fourth embodiment of the present invention.

FIG. 17 is a block diagram showing the configuration of a semiconductor storage device 40 according to a fourth embodiment of the present invention; that is, a configuration using a physical fuse and ferroelectric memory (FeRAM) as nonvolatile memory.

As shown in FIG. 17, the semiconductor storage device 40 is made up of a memory cell array section 41 formed from nonvolatile memory, and a peripheral circuit section 42 for enabling input/output of data into/from the memory cell array section 41 and memory control.

The memory cell array section 41 is made up of a physical fuse and ferroelectric memory, and individual sections of the configuration will be described below.

Reference numeral 1401 designates a main storage area for storing ordinary data which is formed from the 2T2C ferroelectric memory cell, as in the case of the first embodiment (see FIG. 2). Reference numeral 1408 designates a redundant storage area for storing information in lieu of a faulty area (a deficient memory cell) of the main storage area 1401, and, like the main storage area 1401, the redundancy area is formed from the 2T2C ferroelectric memory cell.

Reference numerals 1403 and 1407 designates first setting function storage areas for storing information about operation modes, function settings, and the like, of the semiconductor storage device 40, and, as in the case of the first embodiment, the first setting function storage areas are formed from the 2T2C ferroelectric memory cell.

Reference numeral 1402 designates a second setting function storage area for storing information about the operation modes, function settings, or the like, of the semiconductor storage device 40. As in the case of the first embodiment, the second setting function storage area is formed from a physical fuse (see FIG. 3).

Reference numeral 1404 designates a sense amplifier (see FIG. 4).

The first setting function storage area 1403 and the second setting function storage area 1402 are each split into a plurality of areas. For instance, in the embodiment shown in FIG. 17, the area 1402 is divided into two areas 1402A, 1402B, and the area 1403 is divided into two areas 1403A, 1403B. The areas 1402A, 1403A store faulty address information, and the areas 1402B, 1403B store operation modes.

Figure 18:
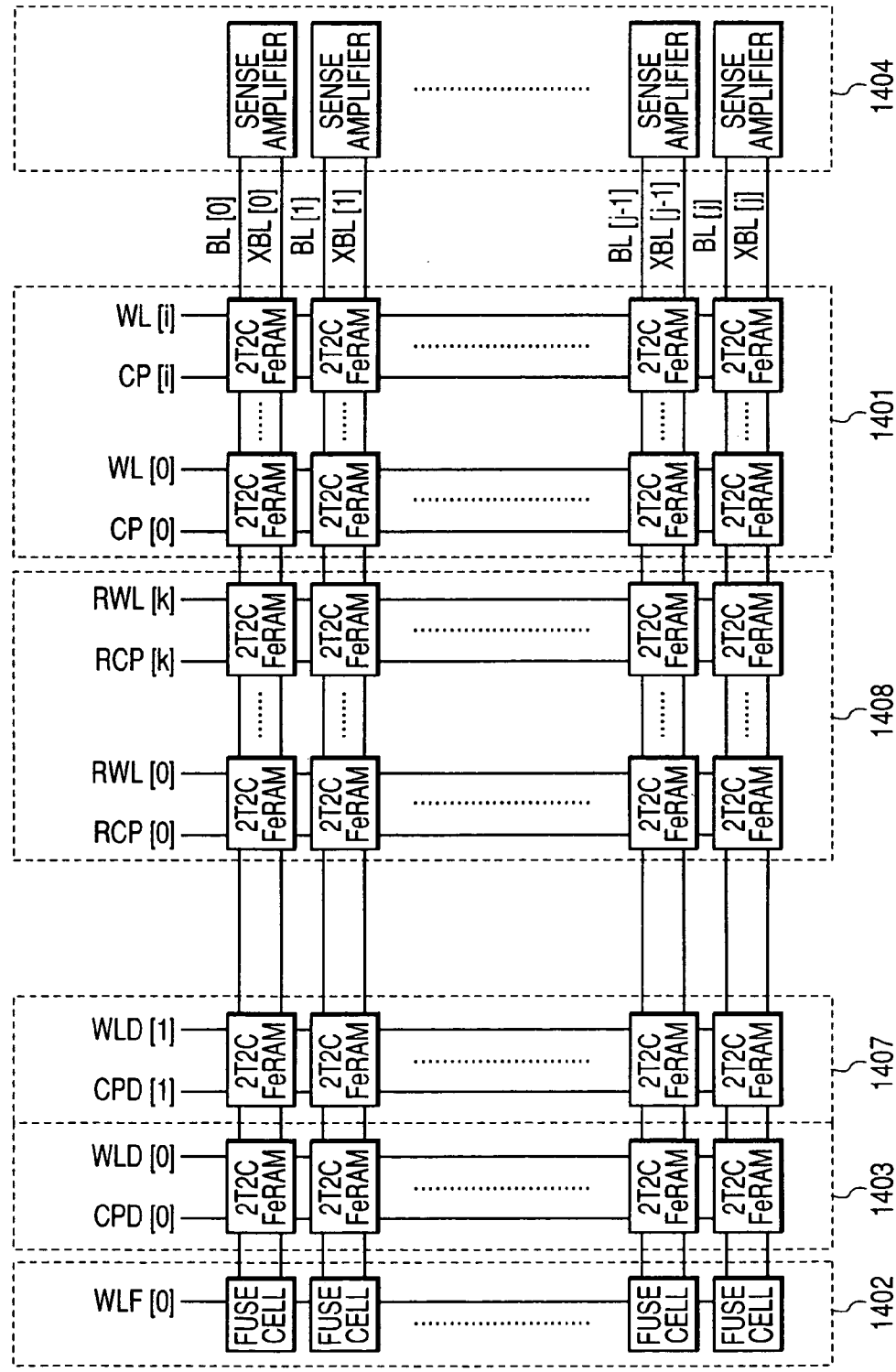
FIG. 18 is a view showing the configuration of the memory cell array section shown in FIG. 17.

As shown in FIG. 18, the previously-described two types of memory are arranged in a two-dimensional matrix configuration within the memory cell array section 41 formed from the individual sections set forth. The memory cell array section 41 is formed from the second setting function storage area 1402 formed from a physical fuse in a number of 1×j; the first setting function storage areas 1403 and 1407 which are each formed from ferroelectric memory in a number of 2×j; a main storage area 1401 which is formed from ferroelectric memory in a number of i×j and stores ordinary data; the redundant storage area 1408 formed from ferroelectric memory of k×j; and the sense amplifier 1404 in a number of 1×j.

The peripheral circuit section 42 that performs input/output of data into/from the memory cell array section 41 of the previously-described nonvolatile memory and memory control is formed from the individual sections shown in FIG. 17.

Reference numeral 1410 designates an operation mode register for temporarily storing operation mode settings; and 1411 designates a faulty address register for temporarily storing faulty address information.

Reference numeral 1412 designates a memory control circuit. The memory control circuit 1412 controls reading/writing of data in/from the memory cell array section 41, transfer (transfer A) of data pertaining to the area 1402A or 1403A to the faulty address register 1411, and transfer (transfer B) of data pertaining to the area 1402B or 1403B to the operation mode register 1410.

Reference numeral 1413 designates a command decoder which generates an internal control signal by means of ascertaining an external control signal.

Reference numeral 1414 designates an address decoder for decoding an external address; and 1415 designates a data input/output circuit which acquires external data and outputs data.

Next, reference numeral 1416 designates a decoder which outputs a selection signal to be used for selecting a transfer source for the transfers A, B.

Reference numeral 1417 designates a source voltage detection circuit which outputs a selection signal to be used for selecting a transfer source for the transfer B on the basis of the result of detection of a source voltage.

Figure 19:
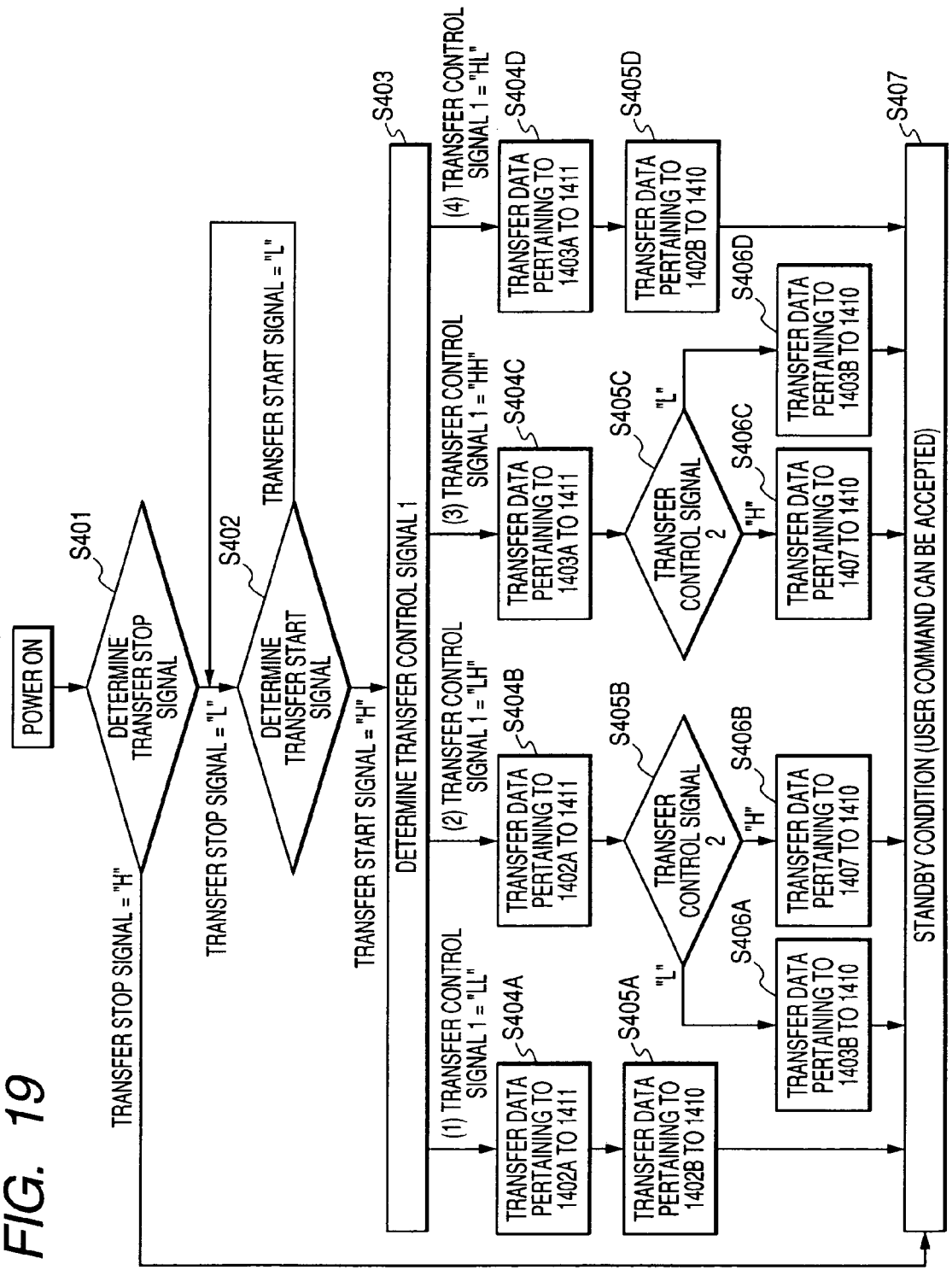
FIG. 19 is a flowchart for describing transfer of faulty address data and operation for setting an operation mode, both of which are performed in the semiconductor storage device according to the fourth embodiment of the present invention.

Next, a flowchart shown in FIG. 19 will be used to describe flow along which are set transfer of faulty address data in the semiconductor storage device 40 of the present embodiment acquired after power-on and setting of an operation mode.

Desired data are written in advance in the areas 1402A, 1402B, 1403A, 1403B, and 1407.

After power has been turned on while a transfer stop signal and a transfer start signal are held at "L," the transfer start signal is brought to "H." Thereby, the transfer stop signal is determined to be "L" through transfer stop signal determination (S401). The transfer start signal is determined to be "H" through transfer start signal determination (S402), and transfer of desired data is commenced.

Next, the transfer selection signal is determined through transfer control signal 1 determination (S403).

The transfer control signal 1 is formed from a combination of a faulty address data transfer control signal 1 ("L" or "H") and an operation mode transfer control signal 1 ("L" or "H"), and four possible types of transfer control signals are available; that is, (1) "LL," (2) "LH," (3) "HH," and (4) "HL" (in sequence of "faulty address data" and "operation mode").

When (1) "LL" or (2) "LH" is taken as the transfer control signal 1, data pertaining to the area 1402A are transferred to the faulty address register 1411 (S404A, S404B).

In the case of (1) "LL," the data pertaining to the area 1402B are transferred to the operation mode register 1410 (S405A).

Meanwhile, in the case of (2) "LH," a transfer selection signal 2 output from the source voltage detection circuit 1417 is determined by means of transfer control signal 2 determination (S405B). When the determination shows that the transfer control signal 2 is determined to be "L," the data pertaining to the area 1403B are transferred to the operation mode register 1410 (S406A). In contrast, when the determination shows that the transfer control signal 2 is "H," the data pertaining to the area 1407 are transferred to the operation mode register 1410 (S406B).

When (3) "HH" or (4) "HL" is taken as the transfer control signal 1, the faulty address data transfer selection signal is "H." Hence, the data pertaining to the area 1403A are transferred to the faulty address register 1411 (S404C, S404D).

In the case of (3) "HH," the transfer selection signal 2 output from the source voltage detection circuit 1417 is determined by means of transfer control signal 2 determination (S405C). When the determination shows that the transfer control signal 2 is "L," the data pertaining to the area 1403B are transferred to the operation mode register 1410 (S406D). In contrast, when the determination shows that the transfer control signal 2 is "H," the data pertaining to the area 1407 are transferred to the operation mode register 1410 (S406C).

In the case of (4) "HL," the data pertaining to the area 1402B are transferred to the operation mode register 1410 (S405D).

In accordance with the combination of the transfer control signal 1 and the transfer control signal 2, data are transferred from the areas 1402A, 1402B, 1403A, 1404B, and 1407 to the operation mode register 1410 and the faulty address register 1411. As a result, setting of a desired operation mode and replacement of a faulty area are performed, so that a state shifts to a standby condition where the semiconductor storage device can accept a user command (S407).

In the present embodiment, a predetermined threshold value is set in advance for the source voltage. In accordance with the voltage detected by the source voltage detection circuit 1417, transfer of the data pertaining to the area 1403B or transfer of the data pertaining to the area 1407 can be selected. Accordingly, the operation mode corresponding to the source voltage applied to the semiconductor storage device 40 can be set.

The case of (1) "LL" corresponds to a case where the faulty address data and the operation mode data are stored in the physical fuse. This case is suitable for, e.g., a high-security semiconductor storage device which prevents the user from rewriting operation mode data and faulty address data.

The case of (2) "LH" corresponds to a case where the faulty address data are stored in the physical fuse and the operation mode data are stored in electrically-rewritable nonvolatile memory (ferroelectric memory). By means of this, for instance, the memory cell in the faulty area can be replaced with high reliability, and this case can be applied to a semiconductor storage device which enables flexible setting of an operation mode.

The case of (3) "HH" corresponds to a case where the faulty address data and the operation mode data are stored in the electrically-rewritable nonvolatile memory (the ferroelectric memory). For instance, this case is applied to a highly-flexible semiconductor storage device which has a high degree of freedom in replacement of a memory cell in a faulty area after assembly and enables flexible setting of an operation mode.

The case of (4) "HL" corresponds to a case where the faulty address data are stored in the electrically-rewritable nonvolatile memory (the ferroelectric memory) and where the operation mode data are stored in the physical fuse. This case can be applied to a high-security semiconductor storage device which has a high degree of freedom in replacement of a memory cell in the faulty area and which prevents the user from rewriting operation mode data.

Figure 20:
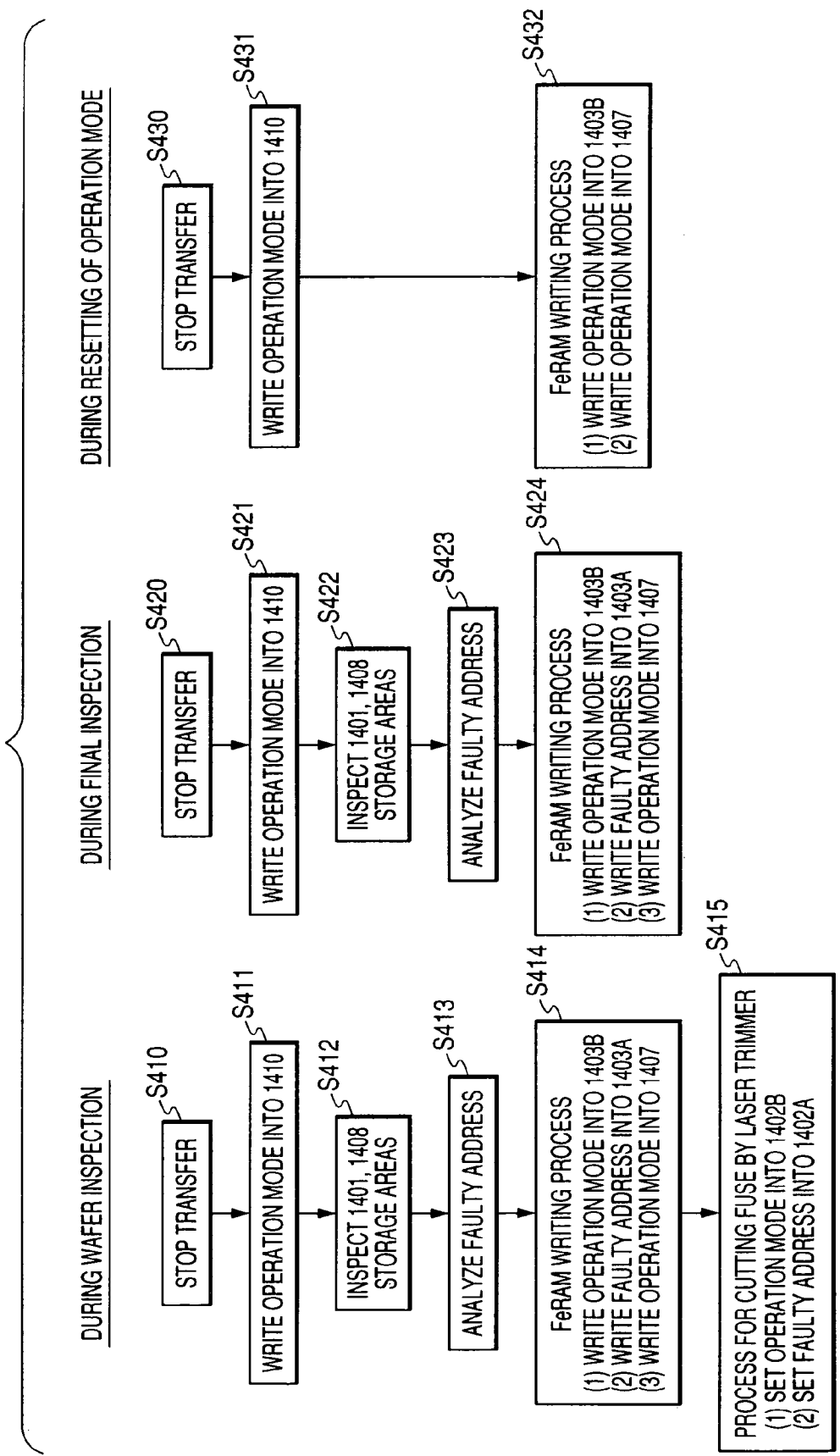
FIG. 20 is a view for describing an inspection flow of the semiconductor storage device according to the fourth embodiment of the present invention.

An example inspection flow is shown in FIG. 20.

At the time of inspection of a wafer, the transfer stop signal is brought to "H," and the transfer start signal is brought to "L" (transfer stop: S410). After power-on, initialization is performed, and desired operation mode data are written into the operation mode register 1410 (S411).

Next, the main storage area 1401 and the redundant storage area 1408 are subjected to memory inspection (S412) and faulty address analysis (S413). The operation mode data in the operation mode register 1410 are written into the area 1403B or the area 1407, and the faulty address is written into the area 1403A (S414).

Next, the operation mode data in the operation mode register 1410 are written into the area 1403B or 1407, and the faulty address is written into the area 1403A (S415).

When the memory cell in the faulty area is again replaced through final inspection, the transfer stop signal is brought to "H," and the transfer start signal is brought to "L" (transfer stop: S420). After power-on, initialization is performed, and desired operation mode data are written into the operation mode register 1410 (S421).

Next, the main storage area 1401 and the redundant storage area 1408 are subjected to memory inspection (S422) and faulty address analysis (S423). The operation mode is written into the area 1403B or 1407, and the faulty address is written into the area 1403A (S424).

When the user sets the operation mode again, the transfer stop signal is brought to "H," and the transfer start signal is brought to "L" (transfer stop: S430). After power-on, initialization is performed, and desired operation mode data are written into the operation mode register 1410 (S431).

Next, a desired operation mode is written into the area 1403B or 1407 (S432).

The present embodiment has illustrated, as an example configuration of the memory cell array section, an exemplary combination of the physical fuse and the ferroelectric memory. However, a combination of fuse memory, which breaks an insulation film, with EPPROM can be easily applied to the configuration of the memory cell array section.

It is also easy to provide the memory cell array section with a plurality of areas corresponding to the areas 1402B, 1403B, to thus increase the degree of freedom of operation mode selection.

The above-described embodiment has illustrated an example where the operation mode data to be transferred by detection of a source voltage can be changed. However, operation setting can be performed in accordance with a temperature change, by means of replacing the source voltage detection circuit with a temperature detection circuit.

Further, by virtue of the semiconductor storage device being provided with the source voltage detection circuit and the temperature detection circuit, the semiconductor integrated device can elaborately cope with changes in the operating environment.

The semiconductor storage device of the present invention is equipped with a plurality of types of nonvolatile memory and configured such that faulty address information, a chip ID, or the like, are stored in once-rewritable memory and such that operation modes or the like are stored in rewritable nonvolatile memory.

Thereby, there can be provided a flexible semiconductor storage device which realizes highly-reliable operation and has a high degree of freedom of operation mode setting.

What is claimed is:

1. A semiconductor storage device having:
    a memory cell array section, into which nonvolatile memory is arranged; and
    a peripheral circuit section for performing input/output of data into/from the memory cell array section and memory control;
    wherein the memory cell array section comprises:
    a main storage area;
    a redundant storage area, for storing information in lieu of a faulty area of the main storage area;

a first setting function storage area and a second setting function storage area for storing faulty address information indicating the faulty area and operation mode setting information about the semiconductor storage device; the first setting function storage area being formed from electrically-rewritable nonvolatile memory; the second setting function storage area being formed from once-rewritable nonvolatile memory;

wherein the peripheral circuit section comprises:
an operation mode register for temporarily storing the operation mode setting information;
a faulty address register for temporarily storing the faulty address information; and wherein the semiconductor storage device comprises:
selective transfer means for selectively transferring, from the first setting function storage area and the second setting function storage area, the operation mode setting information to the operation mode register or the faulty address information to the faulty address register.

2. The semiconductor storage device according to claim 1, wherein the selective transfer means can select, in accordance with a combination of transfer selection signals input from the outside,
transfer of the operation mode setting information and/or the faulty address information from the first setting function storage area or
transfer of the operation mode setting information and/or the faulty address information from the second setting function storage area.

3. The semiconductor storage device according to claim 1, wherein the selective transfer means can select, in accordance with transfer specification information stored in a transfer specification information storage area,
transfer of the operation mode setting information and/or the faulty address information from the first setting function storage area or
transfer of the operation mode setting information and/or the faulty address information from the second setting function storage area.

4. The semiconductor storage device according to claim 3, wherein the transfer specification information storage area is formed from once-rewritable nonvolatile memory.

5. The semiconductor storage device according to claim 3, wherein the transfer specification information storage area is formed from electrically-rewritable nonvolatile memory.

6. The semiconductor storage device according to any one of claims 3 through 5, wherein
the transfer specification information is formed from a plurality of bits;
the semiconductor storage device further comprises
a matching determination circuit for determining occurrence of a match among the plurality of bits; and
the matching determination circuit is configured so as to be able to count mismatched bits or matched bits determined as a result of matching determination; and
the selective transfer means is controlled on the basis of a count result of the mismatched bits.

7. The semiconductor storage device according to claim 1, further comprising:
a source voltage detection circuit; and wherein
the selective transfer means is controlled by source voltage information output from the source voltage detection circuit.

8. The semiconductor storage device according to claim 1, further comprising:
a temperature detection circuit; and wherein
the selective transfer means is controlled by temperature information output from the temperature detection circuit.

9. The semiconductor storage device according to any one of claims 1 through 8, further comprising:
a terminal into which a transfer stop signal is to be input and another terminal into which a transfer start signal is to be input, wherein
when the transfer start signal is brought to "H" after power-on by bringing the transfer stop signal and the transfer start signal to "L," transfer stop signal determination means determines the transfer stop signal as "L," and transfer start signal determination means determines the transfer start signal "H," thereby commencing transfer of the operation mode setting information and/or the faulty address information.

10. The semiconductor storage device according to any one of claims 1 through 9, wherein
the first setting function storage area is formed from ferroelectric memory;
the second setting function storage area is formed from physical fuse memory; and
an operation mode register and a faulty address register are formed from SRAM.

* * * * *